(12) United States Patent
West et al.

(10) Patent No.: US 8,064,200 B1
(45) Date of Patent: Nov. 22, 2011

(54) COOLING A CHASSIS BY MOVING AIR THROUGH A MIDPLANE BETWEEN TWO SETS OF CHANNELS ORIENTED LATERALLY RELATIVE TO ONE ANOTHER

(75) Inventors: Stephen J. West, Petaluma, CA (US);
Scott Pradels, Santa Rosa, CA (US);
Stephen S. Greer, Santa Rosa, CA (US)

(73) Assignee: Cyan Optics, Inc., Petaluma, CA (US)

( * ) Notice: Subject to any disclaimer, the term of this patent is extended or adjusted under 35 U.S.C. 154(b) by 397 days.

(21) Appl. No.: 12/210,211

(22) Filed: Sep. 14, 2008

Related U.S. Application Data

(63) Continuation-in-part of application No. 12/148,281, filed on Apr. 16, 2008.

(51) Int. Cl.
*H05K 7/20* (2006.01)
(52) U.S. Cl. .................. 361/695; 361/694; 454/184
(58) Field of Classification Search .......... 361/688, 361/689, 694, 695; 454/184
See application file for complete search history.

(56) References Cited

U.S. PATENT DOCUMENTS

| | | | |
|---|---|---|---|
| 5,247,427 A * | 9/1993 | Driscoll et al. .......... 361/679.39 |
| 5,594,576 A | 1/1997 | Sutherland et al. | |
| 5,940,266 A * | 8/1999 | Hamilton et al. ............ 361/695 |
| 6,000,464 A * | 12/1999 | Scafidi et al. ............ 165/104.33 |
| 6,606,427 B1 | 8/2003 | Graves et al. | |
| 6,668,106 B1 | 12/2003 | Levine et al. | |
| 6,760,339 B1 | 7/2004 | Noel et al. | |
| 6,816,590 B2 | 11/2004 | Pike et al. | |
| 6,861,943 B2 | 3/2005 | Pike et al. | |
| 6,931,211 B2 | 8/2005 | English et al. | |
| 6,947,623 B2 | 9/2005 | Ramaswami et al. | |
| 7,013,084 B2 | 3/2006 | Battou et al. | |
| 7,079,381 B2 | 7/2006 | Brehm et al. | |
| 7,079,485 B1 | 7/2006 | Lau et al. | |
| 7,099,271 B2 | 8/2006 | Friesen et al. | |
| 7,127,171 B2 | 10/2006 | Martin et al. | |
| 7,209,477 B2 | 4/2007 | Pike | |
| 7,215,552 B2 * | 5/2007 | Shipley et al. ................ 361/721 |
| 7,218,640 B2 | 5/2007 | Lebizay et al. | |
| 7,242,867 B1 | 7/2007 | Clouinard | |
| 7,251,256 B1 | 7/2007 | Barry et al. | |

(Continued)

OTHER PUBLICATIONS

Advanced TCA, PICMG 3.0 Short Form Specification, Jan. 2003, pp. 34.

(Continued)

*Primary Examiner* — Gregory D Thompson
(74) *Attorney, Agent, or Firm* — Silicon Valley Patent Group LLP; Omkar Suryadevara

(57) ABSTRACT

Heat dissipating electronic components and circuitry in a communication chassis are cooled by moving air at least through a midplane, between two groups of channels that are laterally oriented relative to one another. In an illustrative embodiment, channels of one group are oriented vertically while channels of another group are oriented horizontally. Each channel, regardless of whether it is vertical or horizontal, is defined by space in the chassis between adjacent circuit boards. Circuit boards on one side of the midplane are electrically connected to circuit boards on the other side of the midplane by orthogonal connectors on the midplane. The midplane additionally has openings that enable movement of air between vertically-oriented channels and horizontally-oriented channels. Circuit boards of the two orientations are cooled by increasing air pressure in vertically-oriented channels or by decreasing air pressure in horizontally-oriented channels or both, depending on the embodiment.

27 Claims, 20 Drawing Sheets

U.S. PATENT DOCUMENTS

| | | | |
|---|---|---|---|
| 7,263,290 B2 | 8/2007 | Fortin et al. | |
| 7,272,309 B1 | 9/2007 | Tamil et al. | |
| 7,280,356 B2 * | 10/2007 | Pfahnl et al. | 361/695 |
| 7,289,436 B2 | 10/2007 | Schaller et al. | |
| 7,460,482 B2 | 12/2008 | Pike | |
| 7,466,924 B2 | 12/2008 | English et al. | |
| 7,539,184 B2 | 5/2009 | Campini et al. | |
| 7,593,225 B2 * | 9/2009 | Sasagawa et al. | 361/695 |
| 7,619,886 B2 | 11/2009 | Soetemans et al. | |
| 7,644,215 B2 | 1/2010 | Wallace et al. | |
| 7,653,052 B2 | 1/2010 | Pike et al. | |
| 7,693,976 B2 | 4/2010 | Perry et al. | |
| 7,707,304 B1 | 4/2010 | Lolayekar et al. | |
| 7,710,866 B2 | 5/2010 | Soetemans et al. | |
| 7,722,359 B1 * | 5/2010 | Frangioso et al. | 439/61 |
| 7,796,501 B2 | 9/2010 | Oltman et al. | |
| 7,801,120 B2 | 9/2010 | Steinmetz et al. | |
| 7,818,387 B1 | 10/2010 | King et al. | |
| 7,821,790 B2 | 10/2010 | Sharma et al. | |
| 7,852,781 B1 | 12/2010 | Felton et al. | |
| 2002/0176131 A1 | 11/2002 | Walters et al. | |
| 2003/0033409 A1 | 2/2003 | King et al. | |
| 2003/0081624 A1 | 5/2003 | Aggarwal et al. | |
| 2003/0101426 A1 | 5/2003 | Sarkinen et al. | |
| 2003/0210870 A1 | 11/2003 | Graves | |
| 2004/0264128 A1 | 12/2004 | Crippen et al. | |
| 2005/0207134 A1 * | 9/2005 | Belady et al. | 361/796 |
| 2006/0067049 A1 * | 3/2006 | Horiguchi et al. | 361/695 |
| 2007/0293137 A1 * | 12/2007 | Crippen et al. | 454/184 |
| 2008/0160899 A1 | 7/2008 | Henry et al. | |
| 2008/0180903 A1 * | 7/2008 | Bisson et al. | 361/687 |
| 2009/0002938 A1 * | 1/2009 | Stewart et al. | 361/687 |
| 2009/0154098 A1 * | 6/2009 | Nguyen | 361/695 |
| 2009/0257751 A1 | 10/2009 | Sadananda et al. | |
| 2010/0064169 A1 | 3/2010 | Davies et al. | |
| 2010/0166422 A1 | 7/2010 | Shanbhag et al. | |
| 2011/0069954 A1 | 3/2011 | Hu et al. | |

OTHER PUBLICATIONS

PICMG® 3—Frequently Asked Questions, compiled by PICMG President Joe Pavlat, believed to be prior to Sep. 14, 2008, pp. 6.
U.S. Appl. No. 12/148,281 by Stephen J. West et al. filed Apr. 16, 2008.
Office Action in U.S. Appl. No. 12/148,281, filed Feb. 8, 2011.
Response to Office Action in U.S. Appl. No. 12/148,281, filed Mar. 8, 2011.
Amendment dated Jul. 1, 2011 in U.S. Appl. No. 12/148,281, p. 8.
Office Action dated Apr. 1, 2011 in U.S. Appl. No. 12/148,281, p. 13.

* cited by examiner

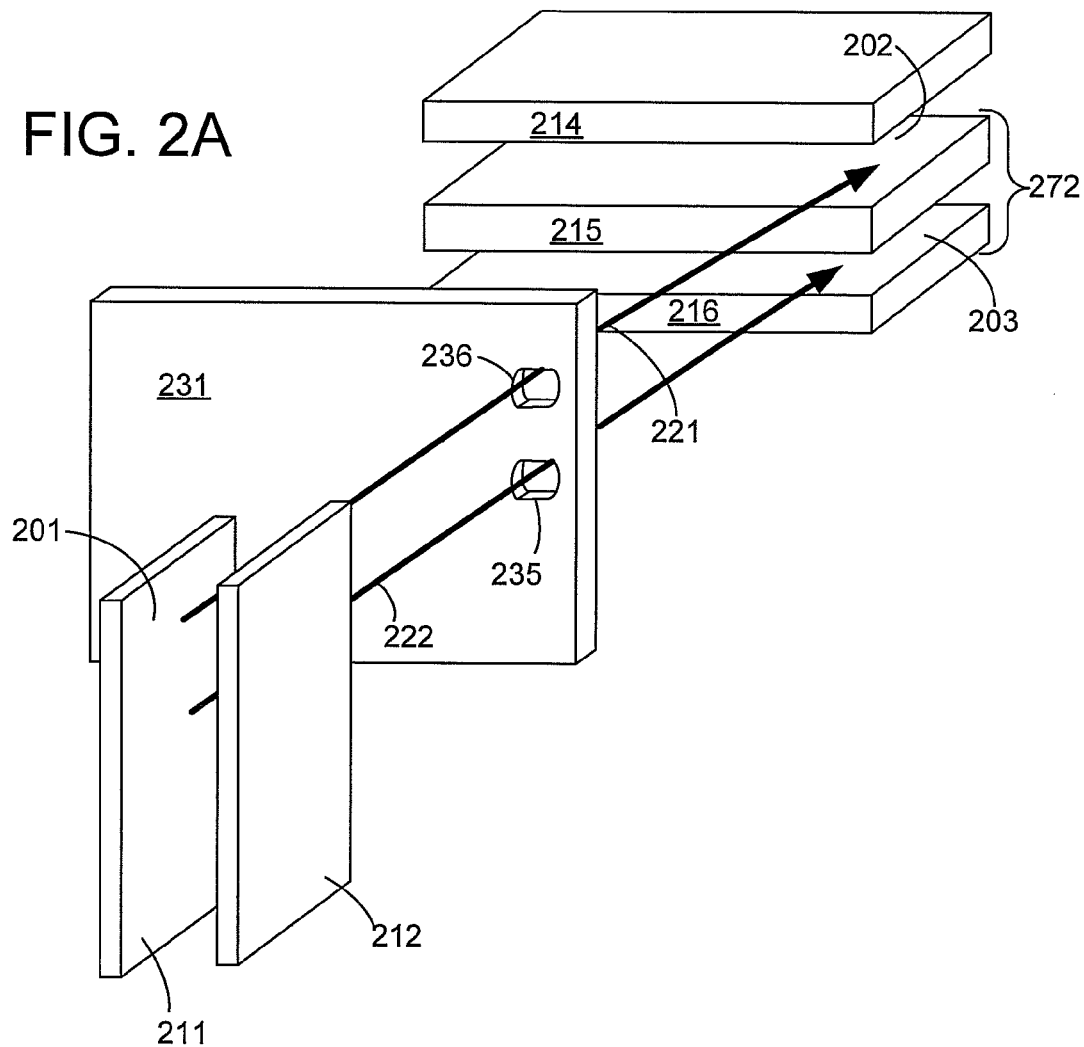

COOLING A CHASSIS BY MOVING AIR THROUGH A MIDPLANE BETWEEN TWO SETS OF CHANNELS ORIENTED LATERALLY RELATIVE TO ONE ANOTHER

CROSS REFERENCE TO PARENT APPLICATION

This application is a continuation-in-part application of U.S. patent application Ser. No. 12/148,281 filed on Apr. 16, 2008 by Stephen J. West as the first named inventor, entitled "MULTI-FABRIC SHELF FOR A TRANSPORT NETWORK", which is incorporated by reference herein in its entirety.

BACKGROUND

Density and power dissipation of electronics used in telecommunications is increasing. Effective cooling design is a critical component of the design of the chassis (also called "shelf") commonly used to house such electronic equipment. Prior art methods of cooling are illustrated (FIG. 1) by the Advanced Telecommunications Computing Architecture (ATCA), a series of industry specification standards for next generation carrier grade communications equipment, such as ATCA 3.0. The ATCA specification defines the physical and electrical characteristics of such as form factors, power, cooling, management interfaces, and the electromechanical specification of ATCA-compliant boards.

FIG. 1 illustrates a side view of a prior art shelf 100 in conformance with ATCA. Shelf 100 has fans 121 and 122 located adjacent to a rear side of shelf 100. When fans 121 and 122 are operated, air is pulled into shelf 100 at a front side into a bottom plenum 110. From plenum 110, a portion of air is pulled into a planar channel 111 between two front boards, as illustrated by arrows 101 and 102. From planar channel 111 air is pulled into a top plenum 112 as shown by arrows 104 and 105. In addition, air is also pulled from bottom plenum 110 into another planar channel 113 that is defined between two rear transition modules (RTMs), as illustrated by arrow 103. Air in channel 113 is pulled into the top plenum 112 as illustrated by arrow 106.

Inventors of the current patent application believe that improvements in the prior art air flow shown in FIG. 1 are desired.

SUMMARY

In accordance with the invention, heat dissipating electronic components and circuitry in a communication chassis are cooled by moving air at least through a wall (called "midplane") that is positioned between two groups of planar channels oriented laterally relative to one another. In an illustrative embodiment, planar channels within one group are oriented vertically and planar channels within another group are oriented horizontally. Each planar channel, regardless of whether it is vertical or horizontal, is defined by space in the chassis between adjacent circuit boards. Circuit boards on one side of the midplane are electrically connected to circuit boards on the other side of the midplane by orthogonal connectors in the midplane. The midplane additionally has openings that support movement of air between vertically-oriented channels and horizontally-oriented channels. In one embodiment, the openings are located at intersections between vertically-oriented channels and horizontally-oriented channels (formed by assuming zero midplane thickness).

Circuit boards in the two orientations are cooled by causing air to flow across them by either increasing air pressure in vertically-oriented channels or decreasing air pressure in horizontally-oriented channels or both, depending on the embodiment. Changes in air pressure are accomplished by use of fans in many embodiments. Certain embodiments that do not use fans within a chassis use an external forced air cooling system (by coupling the vertical and horizontal channels of the chassis directly or indirectly to outlet(s) and inlet(s) of the system). Increasing air pressure in vertically-oriented channels (by use of a fan to blow air therein) results in air being pushed via midplane openings into horizontally-oriented channels wherefrom the air leaves the chassis. Alternatively, or additionally, decreasing the air pressure in the horizontally-oriented channels results in air being pulled through the midplane openings, from vertically-oriented channels.

One illustrative embodiment of such a chassis further includes an intake plenum located in an air flow path from ambient into the vertically-oriented channels. The illustrative embodiment further includes an exhaust plenum located in an air flow path from the vertically-oriented channels to the ambient. Use of either or both plenums as just described for the illustrative embodiment balances air flow through the chassis, which enables the chassis to continue operating even after failure of one fan among a group of fans that are used to change air pressure. The just described illustrative embodiment also includes additional vertical channels, on the same side as and adjacent to the horizontal channels, and these additional vertical channels also receive air from the above-described vertical channels, by movement of additional air through the midplane.

BRIEF DESCRIPTION OF THE FIGURES

FIG. 2A illustrates, in an exploded perspective view, use of two groups of planar channels in accordance with the invention, one group of planar channel oriented vertically and another group of planar channels oriented horizontally.

DETAILED DESCRIPTION

Figure 1:
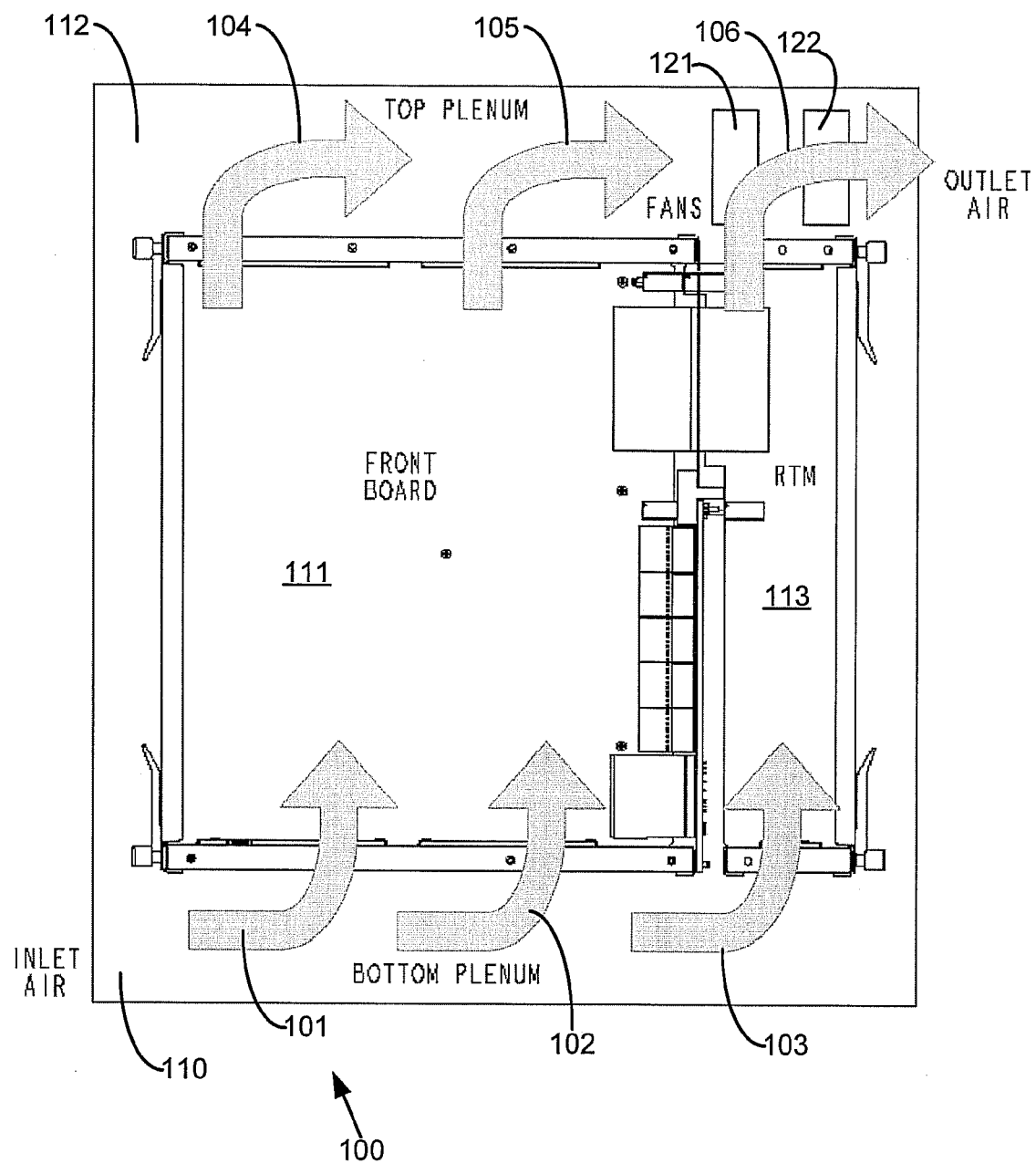
FIG. 1 illustrates, in a cross-sectional side view, a chassis of the prior art.

In accordance with the invention, a shelf (also called "chassis") of heat dissipating electronic components and circuitry in a communication network is cooled by air flowing from a vertical channel 201 (FIG. 2A) into multiple horizontal channels 202 and 203 via openings 235 and 236 in a wall (called midplane) 231 that may be located approximately half-way within the shelf. The just-described channels 201, 202 and 203 are all planar, wherein two dimensions of each channel (e.g. length and width) are several times (e.g. an order of magnitude) larger than a third dimension of the channel (e.g. thickness). Each of channels 201, 202 and 203 is formed by space between adjacent circuit boards, such as printed circuit boards (PCBs) that carry electronic circuitry, such as switches, routers, transceivers, serializers, deserializers, and/or microprocessors.

In FIG. 2A, a vertical channel 201 is formed by insertion of circuit board 211 adjacent to a right side wall 212 of the chassis, through a front side of a chassis (not shown in FIG. 2A), by a human sliding board 211 into a vertical slot in a front region (also called "front volume") of the chassis. Similarly, horizontal channels 202 and 203 are respectively formed by insertion of circuit boards 215 and 216 through a rear side of the chassis, by the human sliding circuit boards 215, 216 into a rear region (also called "rear volume") of the chassis.

Figure 2B:
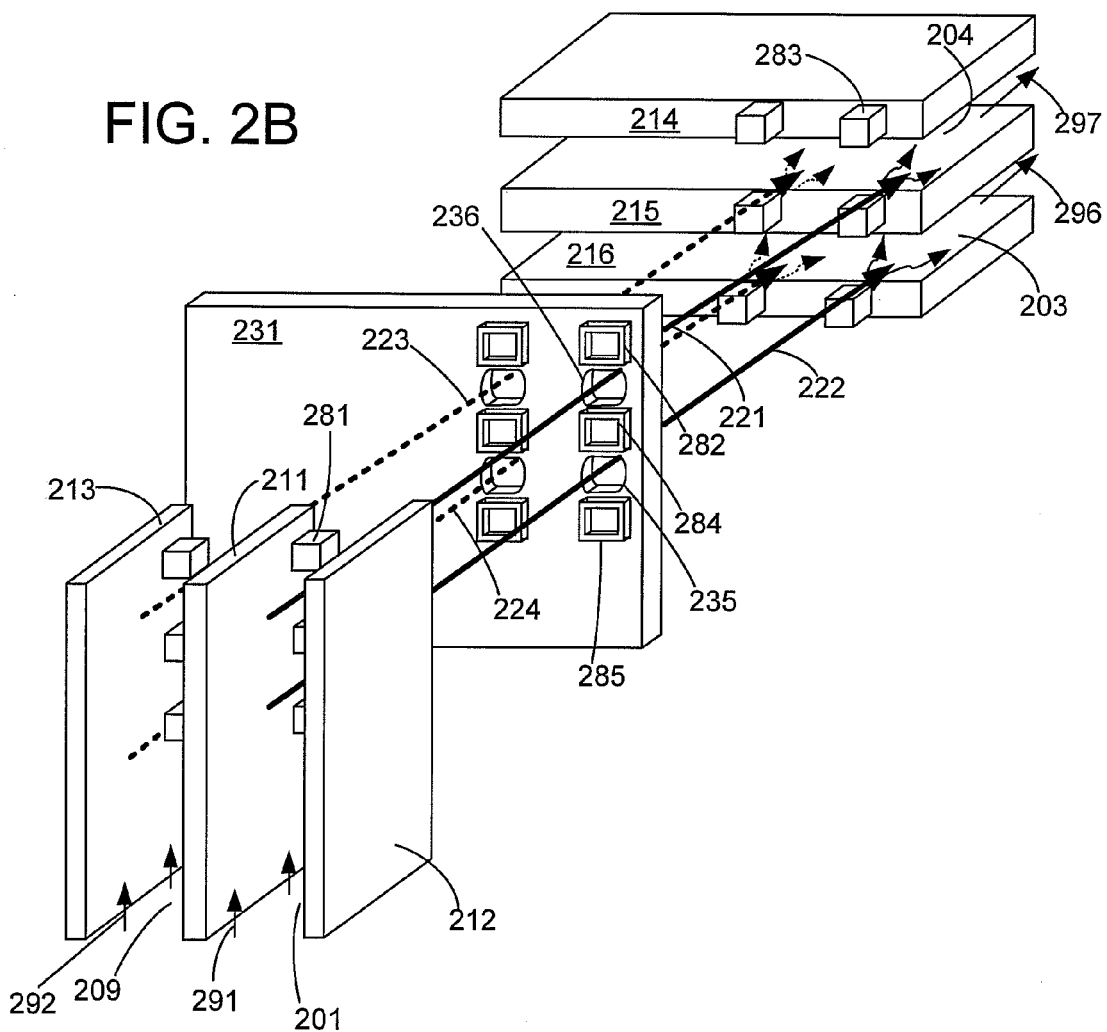
FIG. 2B illustrates, in a perspective view, the set of channels of FIG. 2A and further shows air flow within channels, as well as connectors that electrically connect circuit boards in one group to circuit boards in the other group.

On completely sliding a circuit board (such as one of boards 211, 215 and 216 described above), one or more connectors on the circuit board engage with corresponding orthogonal connector(s) in midplane 231 (not shown in FIG. 2A to improve legibility of this drawing; instead please see FIG. 2B). Accordingly, midplane 231 provides electrical connectivity between one or more horizontally-oriented boards 215, 216 and vertically-oriented board 211.

In several embodiments of the invention, channels 202 and 203 are oriented laterally (i.e. sideways, e.g. perpendicular) relative to channel 201. In one embodiment, the just-described two orientations are exactly perpendicular to one another, although note that precise angles of such orientation are different in alternative embodiments. In some alternative embodiments, the just-described orientations are just approximately (but not exactly) perpendicular within a predetermined tolerance on their relative angular orientation (e.g. 10%).

During operation, air pressure relative to ambient is changed within the chassis, either in one group or in both groups of channels, depending on the embodiment. For example, certain embodiments create air pressure greater than ambient in vertically oriented channel 211, thereby to push air from channel 211 via midplane openings 235 and 236, as streams (also called "flows") 221 and 222 that respectively enter the horizontal channels 202 and 203. Other embodiments create negative pressure in horizontal channels 202 and 203, thereby to cause air to be pulled into horizontal channels 202 and 203 from midplane openings 235 and 236, as streams 221 and 222 from vertical channel 201. Still other embodiments may change pressure in both groups of channels simultaneously so as to create a greater air flow (per unit time), relative to embodiments that change air pressure in only a single group of channels.

Regardless of where air pressure is changed, in the embodiment illustrated in FIG. 2A vertical channel 201 receives cold air from outside the shelf. The cold air drawn into channel 201 warms up due to heat dissipated by circuit board 211. Accordingly, a flow 221 (FIG. 2A) of the warmed air from channel 201 enters channel 202, while another flow 222 of the air in channel 201 simultaneously enters channel 203. Thereafter, air in flows 221 and 222 which enters respective channels 202 and 203 is further heated up, by heat being dissipated by the respective pairs of circuit boards 214, 215 (for channel 202) and circuit boards 215, 216 (for channel 203). Hot air from flows 221 and 222 leaves the shelf from channels 202 and 203, i.e. is exhausted into ambient.

Cooling of a chassis by air flows 221 and 222 (FIG. 2A) through midplane 231 between planar channels oriented laterally relative to one another has several advantages. Firstly, use of vertical channels (formed by vertical circuit boards) and horizontal channels (formed by horizontal circuit boards) significantly increases the number of electrical connections that can be made between electronic subassemblies used in telecommunication equipment. With such an orthogonal midplane design, high power dissipating switching fabric electronics are built on horizontally mounted blades 215, 216 at the rear of the chassis and optical and/or electrical line cards are built as a vertically mounted blade 211.

In contrast to FIG. 2A, current inventors note that the prior art of FIG. 1 does not disclose horizontally mounted PCB assemblies at the rear of the chassis. The current inventors also note that if FIG. 1's design is used with horizontally mounted PCB assemblies, airflow is likely to be blocked. FIG. 1 does not appear to disclose how to generate air flow to dissipate heat from horizontally mounted PCB assemblies in the rear. Furthermore, FIG. 1 does not seem to take into account the type of front boards and the type of rear boards, i.e. whether switch fabric boards are in the front or the rear of the chassis. Accordingly, embodiments of the type described above in reference to FIG. 2A are believed to be novel, and nowhere disclosed or rendered obvious by any prior art known to the inventors.

Note that in FIG. 2A only three channels have been shown, to improve clarity. Also, the distances in FIG. 2A are exaggerated to further improve clarity and illustrate the inventive concept. Several details related to implementation are further illustrated in FIG. 2B, such as a connector 281 on vertical circuit board 211 that plugs into a corresponding connector 282 on midplane 231. Connector 282 on midplane 231 can also be plugged into on the rear side by connector 283 on board 214. Note that in some embodiments, connector 283 is an orthogonal connector (such as Molex I-Trac) that provides electrical coupling between circuitry in board 211 and circuitry in board 214. As shown in FIG. 2B, an opening for air flow through midplane 231 is typically located between two orthogonal connectors, such as opening 236 between connectors 282 and 284 and opening 235 between connectors 284 and 285.

In some embodiments, the dimensions of connectors and the dimensions of openings in midplane 231 respectively needed for electrical interconnect and cooling are such that space remaining in the midplane 231, e.g. within in a given column (or row) becomes too small to maintain structural integrity (e.g. mechanical strength) of midplane 231. In such embodiments, one or more stiffeners are used to improve the strength of midplane 231. For example, see stiffeners 411A-411C in FIG. 4D. Such stiffeners may be made of any material and of any dimensions selected to improve strength and rigidity e.g. aluminum bars may be used.

FIG. 2B illustrates four air flow patterns 221-224 in accordance with the invention, in the presence of additional circuit boards and additional channels relative to FIG. 2A. Specifically, insertion of circuit board 213 into the front volume 232 (FIG. 5) of the chassis defines an additional vertical channel 209 (FIG. 2B) between circuit boards 211 and 213. Vertical channel 209 provides a flow 223 of air into horizontal channel 204. Dashed arrows in FIG. 2B illustrate air flows 223 and 224 from vertical channel 209 to the respective horizontal channels 204 and 203. Moreover, as illustrated in FIG. 2B, air streams 296 and 297 that carry heat from the chassis, exit into the ambient horizontally.

Figure 2C:
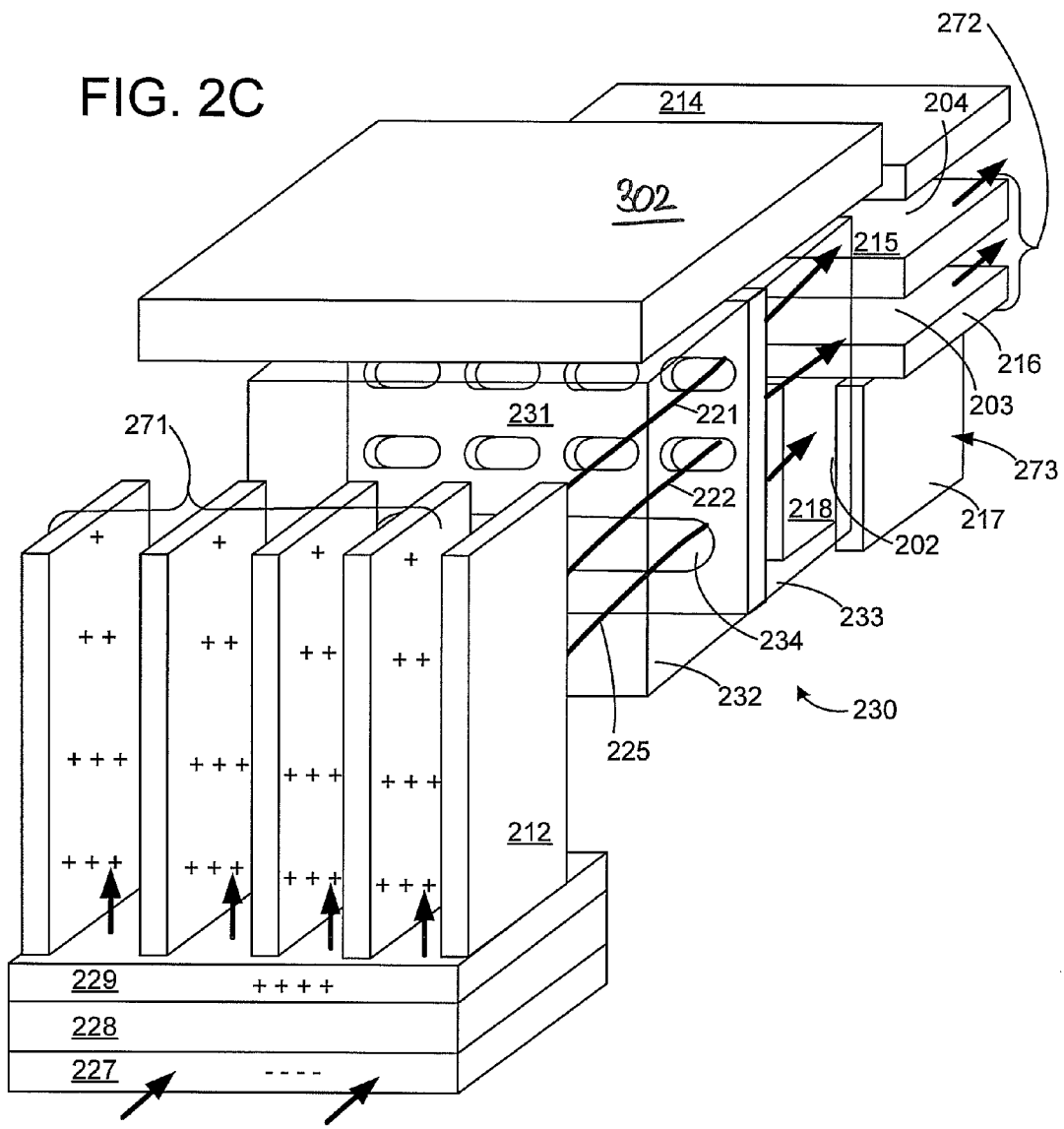
FIG. 2C illustrates, in a perspective view, the set of channels illustrated in FIG. 2B in combination with an intake chamber, a fan assembly and an intake plenum, as well as additional vertical channels, and the shelf shown in an outline form.

In one illustrative embodiment, each vertical channel 201 and 209 has an inlet connected to a common plenum to receive therefrom flows 291 and 292 of air drawn from outside the shelf. For example, flows 291 and 292 are received as shown in FIG. 2C from a plenum 229 (also referred to as an intake plenum) that is horizontally oriented relative to vertical channels 201 and 209. Plenum 229 in turn receives air from one or more fans in a fan assembly 228 located adjacent to plenum 229. Fan(s) in assembly 228 draw cool air from outside the shelf through an inlet chamber 227 (FIG. 2C) and generate negative air pressure (relative to ambient) in chamber 227 as shown by the minus signs "−" in FIG. 2C.

The fans push the outside-drawn air into plenum 229 thereby to generate positive air pressure (relative to ambient) in plenum 229, as shown by the plus signs "+" in FIG. 2C. In the illustrative embodiment, fan(s) 228 push air into plenum 229 through an air filter (not shown). Air in plenum 229 is at high pressure (relative to ambient) and hence moves into vertical channels 201 and 209, via openings in a guide (not shown in FIG. 2B; see guide 305 in FIG. 4G) that defines the slots for circuit boards 211 and 213. The air pressure in vertical channels 201 and 209 is positive, as shown by the plus signs "+" in FIG. 2C. Thus, each of the fan(s) 228 may have its axis of rotation parallel to one of the circuit boards 211, 213.

Figure 5:
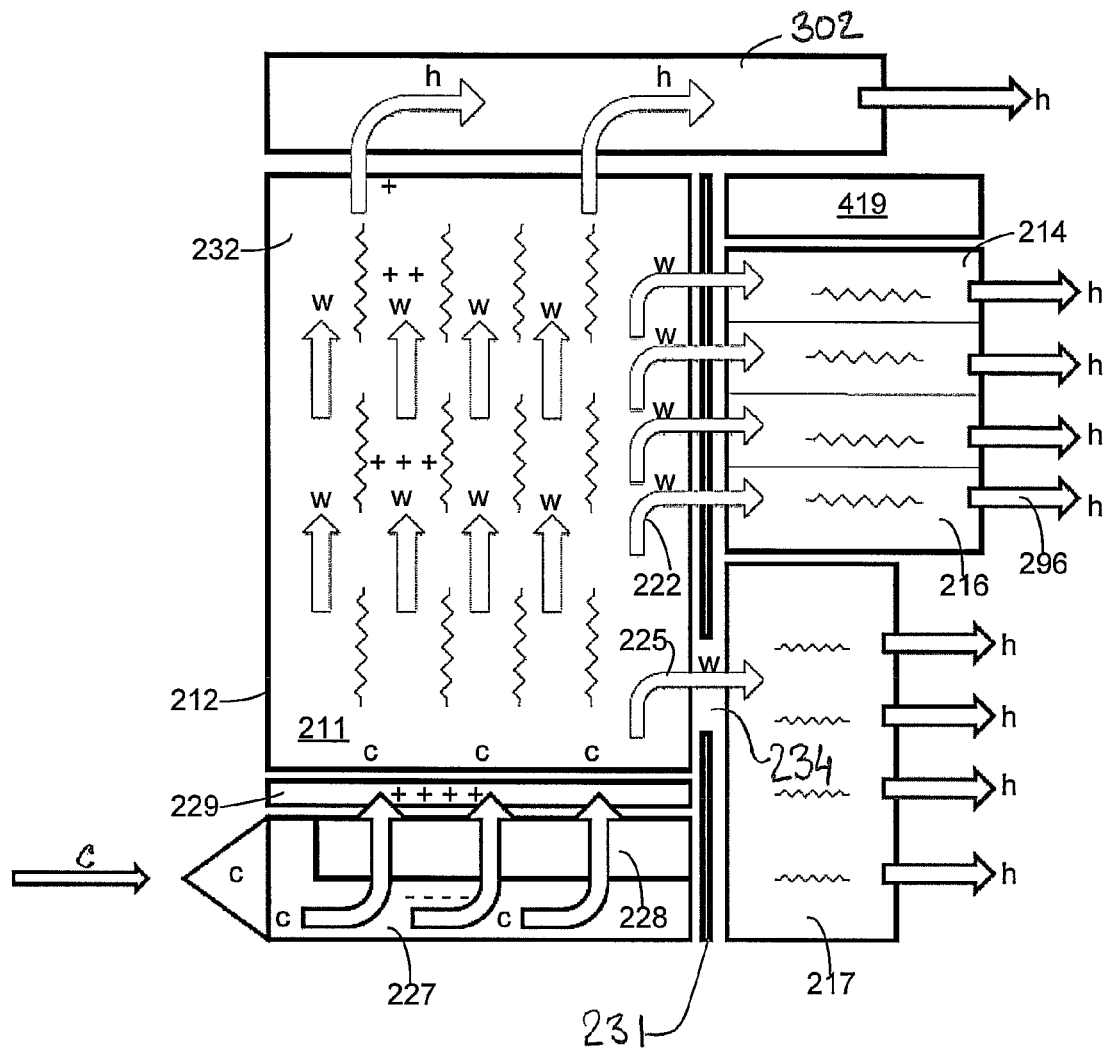
FIG. 5 is a side view of a schematic of resistance to movement of air in a chassis in accordance with the invention.

A schematic diagram of this illustrative embodiment is shown in FIG. 5 wherein the same symbols "+" and "−" are used to indicate air pressures above and below ambient respectively, and additionally in FIG. 5 the symbol "c" denotes cold, "w" denotes warm and "h" denotes hot. As seen in FIG. 5, in one embodiment, hot air exits horizontally from the chassis, and does so throughout the entire rear region thereof (i.e. from the bottom of the backside to the top of the back side).

In an illustrative embodiment, the chassis also includes a top plenum 302 into which air flows from vertical channels 201, 209 etc., due to the positive air pressure therein. The top plenum 302 is used to increase the air flow rate through the vertical channels in some embodiments wherein vertical circuit boards dissipate more heat than horizontal circuit boards.

In some embodiments, the cooling of electronic components uses a minimum rate of flow of cooler air over all components (commonly measured as a velocity in units of linear feet per minute). The flow of air encounters resistance created by the physical size of the components in the channels. Hence, the air flow is balanced in an attempt to ensure that sufficient air flows over all components in all channels. To accomplish this balancing, the resistance to air flow through the alternative exhaust paths is also managed by a human designer of the chassis.

FIG. 2C further illustrates a chassis 230 with a wall 231 in combination with an additional set of vertical circuit boards in the rear of the chassis, such as board 214. Board 214 may be, for example, a rear transition module (RTM). Wall 231 divides shelf 230 into two volumes 232 and 233. Circuit boards 271 that define vertical channels are held in front volume 232 by top and bottom guides (not shown in FIG. 2C, also called "card guides"; see bottom guide 305 in FIG. 4G), each guide including one or more rails (not shown in FIG. 2C) to define a slot for insertion of each circuit board 271 into front volume 232. Moreover, horizontal circuit boards 272 and vertical circuit boards 273 are held in rear volume 233, in two spaces thereof. Specifically, an upper space in rear volume 233 has guides to receive and hold circuit horizontal boards 272 (also called electronic fabric modules or EFM) while a lower space in rear volume 233 has guides to receive and hold vertical circuit boards 273 (also called rear transition modules or RTMs).

Wall 231 has an additional opening 234 that spans across circuit boards 273 that define vertical channels in the rear. Opening 234 enables streams of air (such as stream 225 in FIG. 2C similar to the above-described streams) to pass freely between vertical channels defined by boards 271 in the front and vertical channels defined by boards 273 in the rear. Note that instead of a single opening, other embodiments use one or more rows of openings.

Also, in the example illustrated in FIG. 2C, there are four vertical channels (e.g. channel 201) that are defined by boards 271 in the front, and two horizontal channels 203 and 204 defined by boards 272 in the rear. Accordingly, midplane 231 has eight openings, including opening 235 (FIG. 2B) that passes stream 222 to horizontal channel 203 and opening 236 that passes stream 221 to horizontal channel 204. Note that if there are M vertical channels in a chassis as described herein, and N horizontal channels, then wall 231 has N*M number of openings in this example. In other embodiments, two or more such openings are merged together to form a single slot that serves the same purpose, namely enabling air to move through a midplane.

In one illustrative embodiment, a shelf 230 (FIGS. 2A-2C) includes printed circuit boards containing optical, packet and electrical fabrics in the upper space of rear volume 233, while front volume 232 houses inter-fabric circuitries and external interface circuitries. In an illustrative embodiment, each of packet fabric, electrical fabric and optical fabric is built into its own modular enclosure (called "module") instead of a printed circuit board. For example, see optical fabric module 419 and electrical fabric module 215 in FIG. 4C. Note that air flow between longitudinal and lateral channels as described herein, is in several embodiments, implemented with modules instead of printed circuit boards. Accordingly, the term "circuit boards" is used synonymously with module. Moreover, the term "module" is interchangeable with the term "line card" and with the term "blade," and hence synonymously used herein.

Figure 2D:
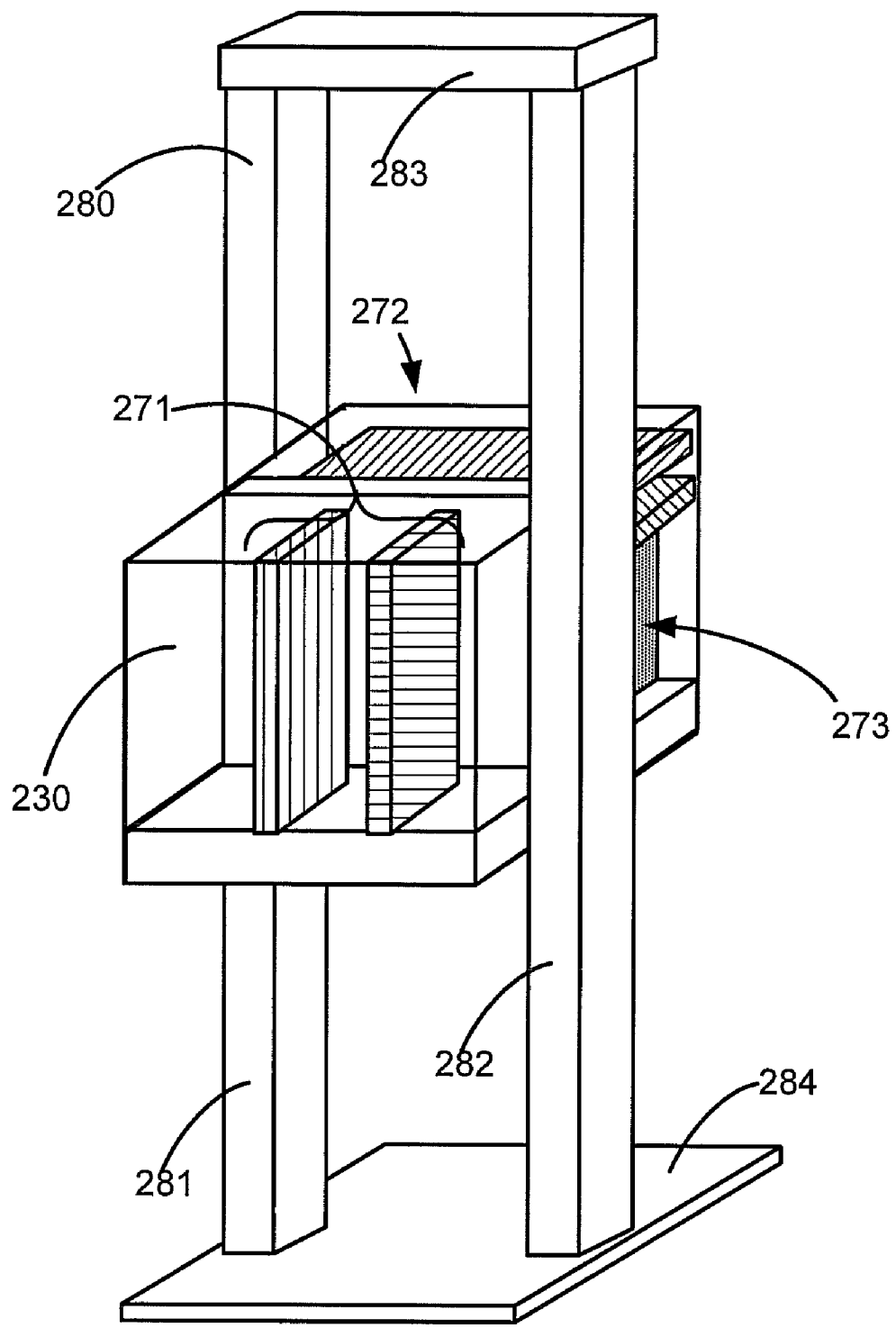
FIG. 2D illustrates the shelf of FIGS. 2B and 2C mounted in a telco rack.

In one embodiment illustrated in FIG. 2D, a chassis 230 is mounted in a rack 280 at a telecommunication facility. Accordingly, chassis 230 has several circuit boards (or modules or line cards) 271 in a front region thereof, oriented vertically parallel to the sides of chassis 230, and perpendicular to midplane 231. For example, if midplane 231 is vertical and in the East-West direction, then circuit boards 271 are also vertical but in the North-South direction. Moreover, in an upper space within rear volume 233, chassis 230 has circuit boards (or modules or line cards) 272 that are horizontally mounted, thereby defining horizontal channels. Additionally, in a lower space within rear volume 233, chassis 230 has additional circuit boards (or modules or line cards) 273 that are vertically mounted, thereby defining vertical channels. The just-described orientation is deliberately chosen to provide maximum connectivity between circuit boards 271, 272 and 273 through midplane 231 (via openings therein). This orientation also provides maximum connectivity between channels that are defined by boards 271, 272 and 273.

Electrical connectors in midplane 231 can be, for example, Molex I-Trac connectors which eliminate the need for PCB-type traces in the midplane. Note that the same type of electrical connectors are used in connecting through the midplane to each of two fabric modules 214 and 215, e.g. packet fabric module and electrical fabric module. One illustrative embodiment utilizes a 6×6 connector that allows for 36 differential pairs per connector. The connector supports serial data rates of up to 12 Gbps.

Note that midplane 231 of the illustrative embodiment does not have any active circuitry to affect optical signals and/or electrical signals that travel between boards in rear volume 233 and boards in front volume 232. In one embodiment, midplane 231 includes one or more conductive sheet(s) for power and/or ground. As noted above, midplane 231 has built in electrical connectors and optical connectors (not shown in FIGS. 2A-2D; see electrical connectors 281, 284 and 285 and optical connector 401 in FIG. 4D) that passively couple connectors on horizontally-oriented boards 272 and vertically-oriented boards 273 in the rear volume 233 to corresponding connectors on vertically-oriented boards 271 in front volume 232. In one illustrative embodiment, midplane 231 has an upper row of optical connectors 401, and four rows of electrical connectors 281, 284, 285 . . . (all not shown in FIGS. 2A-2D; see FIGS. 4D-4J) through which horizontally oriented boards 272 in rear volume 233 are connected to vertically oriented boards 271 in front volume 232.

Shelf 230 has width and depth sufficient to fit within a telco rack 280 (FIG. 2D). Telco rack 280 may be a 7 foot tall open frame consisting of two posts 281 and 282 separated from each other by 23 inches or 600 mm, mounted on a base 284 and connected at the top by a cross-bar 283. Rack 280 is usually bolted to the floor in a central office of a telecommunications carrier. In one embodiment, the design of shelf 100 is based in part on Advanced Telecom Computing Architecture (ATCA), a series of industry specification standards for next generation carrier grade communications equipment, such as ATCA 3.0. The ATCA specification defines the physical and electrical characteristics of such as rack and shelf form factors, power, cooling, management interfaces, and the electromechanical specification of ATCA-compliant boards. In the just-described embodiment, a design described in the ATCA specification is modified by replacing the backplane with a midplane, and by adding horizontal modules.

Figure 2E:
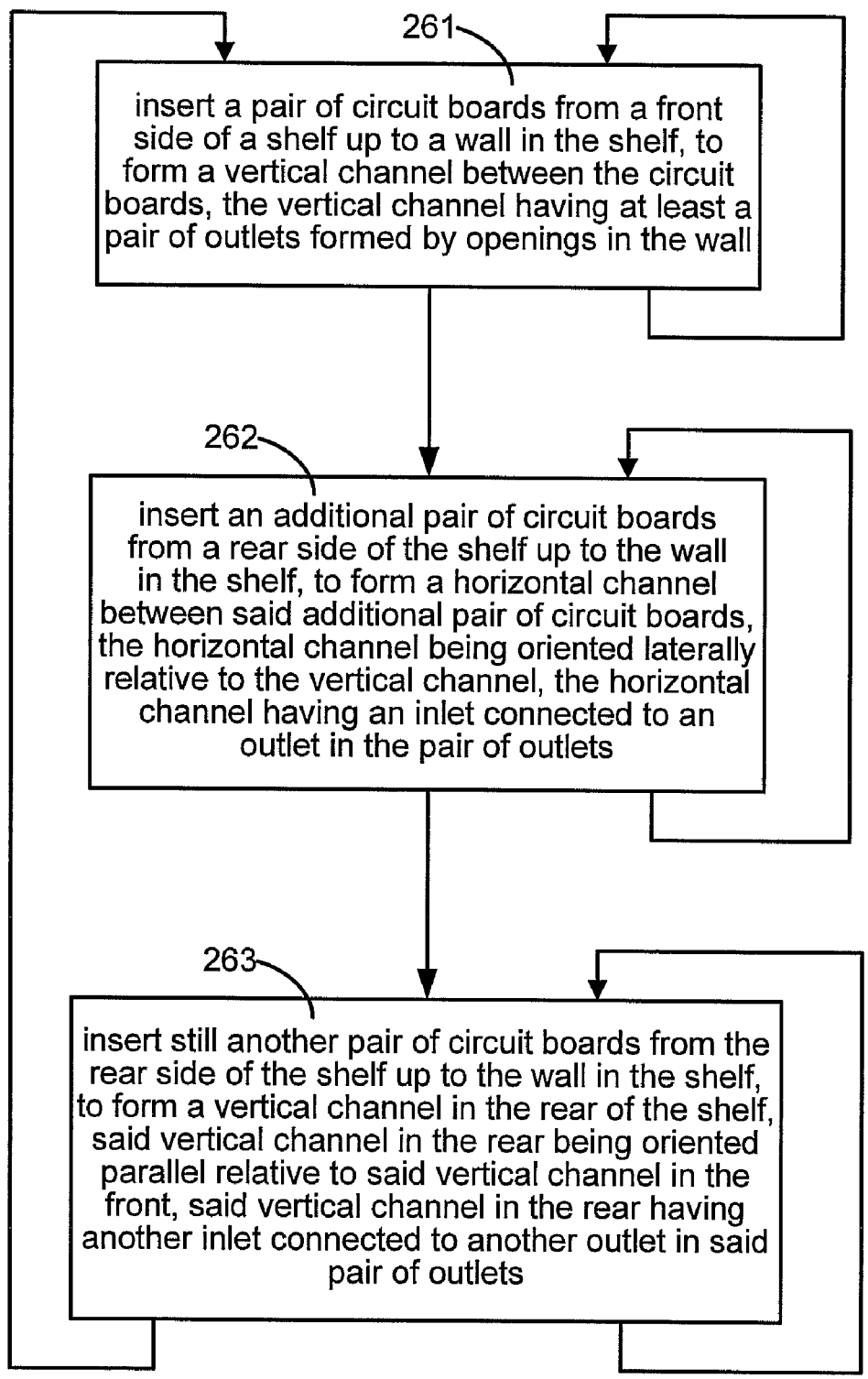
FIG. 2E illustrates, in a flow chart, a method in accordance with the invention, for assembling a shelf of electronics in a communication network.

A method of deploying a chassis 230 is now described in reference to FIG. 2E. Specifically, in act 261, a human inserts a pair of circuit boards 271 from a front side of shelf 230, e.g. between top and bottom guides (see horizontal guide 305) up to a front surface of wall 231 in the shelf, to form a vertical channel between the circuit boards 271. Vertical channel 201 which is thus formed has, at wall 231 multiple outlets into rear volume 233, e.g. formed by openings 234-236 in wall 231 (see FIG. 2C). Note that act 261 can be performed repeatedly. Moreover, act 261 can be performed in stages, e.g. one circuit board in the pair being inserted is first inserted thereby to complete a first stage, followed by insertion of the second circuit board, thereby to complete a second stage.

Additionally, in act 262, the human inserts an additional pair of circuit boards 272 in an upper space within rear volume 233 of shelf 230, e.g. between left and right guides (see vertical guide 491 in FIG. 4G) up to a rear surface of wall 231. On completion of act 262, a channel is formed between the additional pair of circuit boards 272, and this channel is oriented horizontally and therefore laterally relative to the vertical channel in the front volume of the chassis (e.g. in FIG. 2D, the vertical channel is vertical and this channel is horizontal). Note that such a horizontal channel has an inlet connected to an outlet of the vertical channel, via one of openings 235 and 236 in the wall 231.

Furthermore, in act 263, the human inserts still another pair of circuit boards 273 in a bottom space within the rear volume 233 of shelf 230, e.g. between top and bottom guides (see horizontal guide 493 in FIG. 4G) up to wall 231. On completion of act 262, a vertical channel is formed between the additional pair of circuit boards 273 and this channel is oriented longitudinally relative to the vertical channel in the front of the chassis (e.g. in FIG. 2D, the vertical channel is vertical and this exhaust channel is also vertical). Note that this vertical channel in the rear also has an inlet connected to an outlet of the vertical channel in the front, via one or more openings 234 in the wall 231.

Figure 3A:
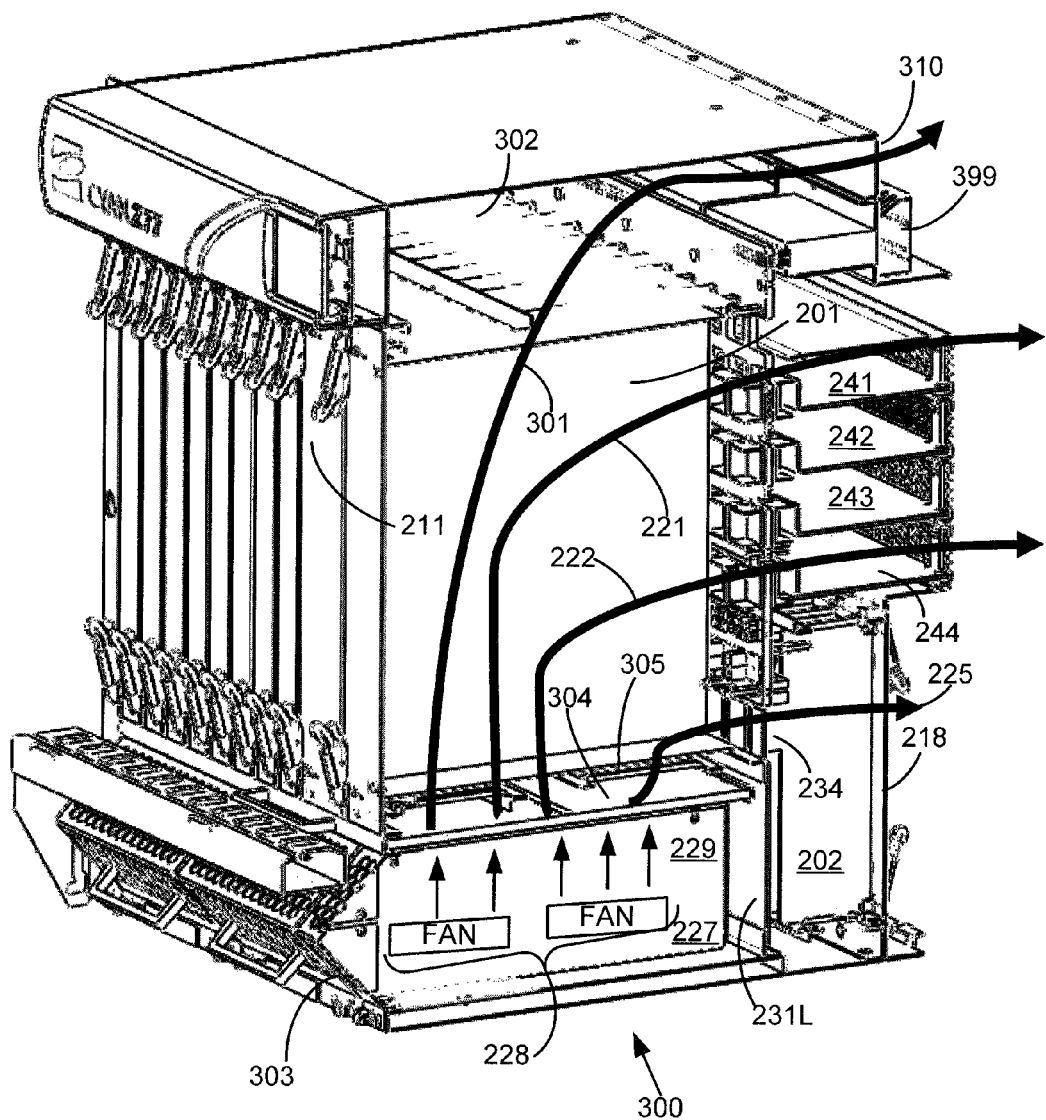
FIG. 3A illustrates, in a perspective view, a chassis in one illustrative embodiment of the invention, and air flow therethrough.

FIG. 3A illustrates an exemplary embodiment of the type described above in reference to FIGS. 2A-2E. Specifically chassis 300 has two fans 228 that together draw air through a grille 303 and push the air into plenum 229. Note that circuit board 218 in the bottom rear is cooled by air from flow 225 that is received via opening 234. Specifically, note that portion 231L of the midplane forces air driven by fans 228 to move through an opening 304 in a horizontal guide 305 into a vertical channel 201. A portion of the air in channel 201 forms a flow 225 that exits through opening 234 into vertical channel 202. By eliminating a pathway for air to go directly into channel 202 from plenum 229, cooling efficiency is improved because the cold air is first used to remove heat from boards 271.

FIG. 3A further illustrates a top plenum 302 (also called "exhaust plenum") that is located above circuit boards 271. Hence, in this embodiment, circuit boards 271 located in front volume 232 are sandwiched between the two plenums 302 and 229. In this embodiment, at least some air exits each vertical channel, (e.g. channel 201) from the top of circuit boards 271 into plenum 302 and travels therefrom to an exhaust manifold 310 as stream 301 and then leaves chassis 300. Note that the chassis has a power module 399 located adjacent to the exhaust manifold 310 and hence airflow 301 flows around power module 399 when exiting the chassis. Although flows 301, 221, 222 and 225 are illustrated in FIG. 3A by arrows originating from openings in horizontal guide 305, it is to be understood that in practice no streams exist in front volume 232 due to turbulent mixing of the air in each vertical channel (e.g. channel 201) formed by boards 271. Instead, arrows 301, 221, 222 and 225 are merely illustrative of volume(s) of air moving between various channels.

Figure 3B:
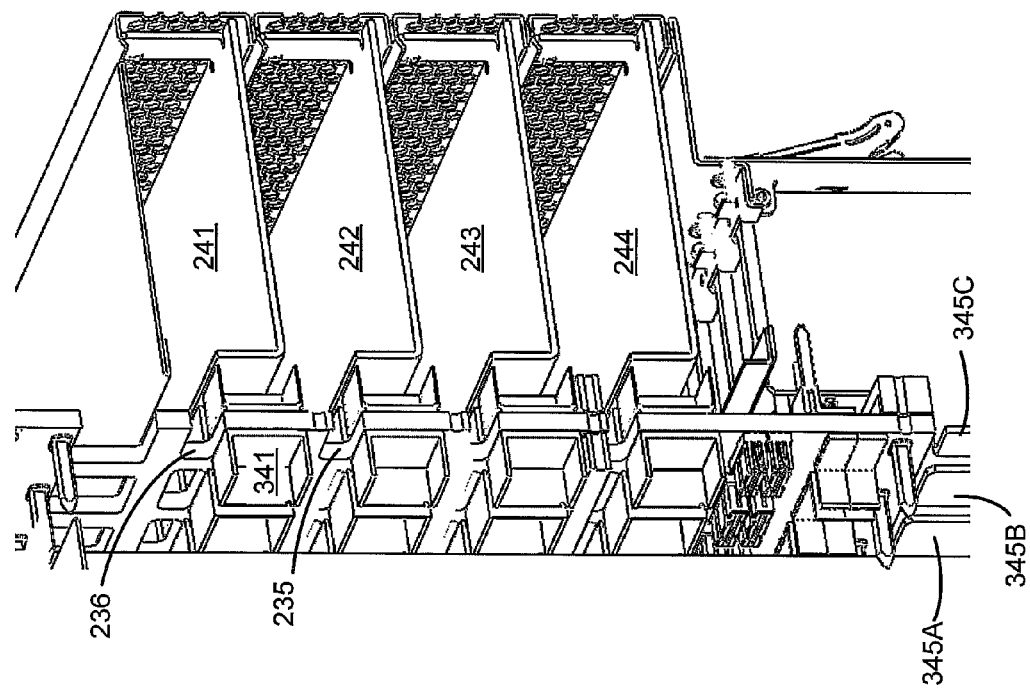
FIG. 3B is an enlarged view of a portion of the chassis illustrated in FIG. 3A.

FIG. 3B illustrates an enlarged view of a portion of midplane 231 showing openings 235 and 236 and an orthogonal connector 341 located between openings 235 and 236. Note that in FIGS. 3A and 3B the chassis is illustrated with trays 241-244 to be replaced during normal operation with circuit boards that contain electronic components and dissipate heat, such as horizontal boards 214, 215, 216 etc. Note further that in embodiments wherein there are no active electronic components and circuitry in a particular slot, an opening in midplane 231 is not required. Hence, air movement through midplane 231 is blocked and/or reduced, as illustrated by placeholder card(s) having wall(s) (see walls 345A-345C in FIG. 3B) to reduce the opening's cross-section available for air movement, so as to retain a positive pressure within the corresponding vertical channel (in volume 232 in FIG. 2C). Also as illustrated in FIG. 4C, the chassis may have an optical module 419 that does not does not generate heat, and accordingly there is no air flow provided to cool module 419 as shown in FIG. 5.

Figure 3C:
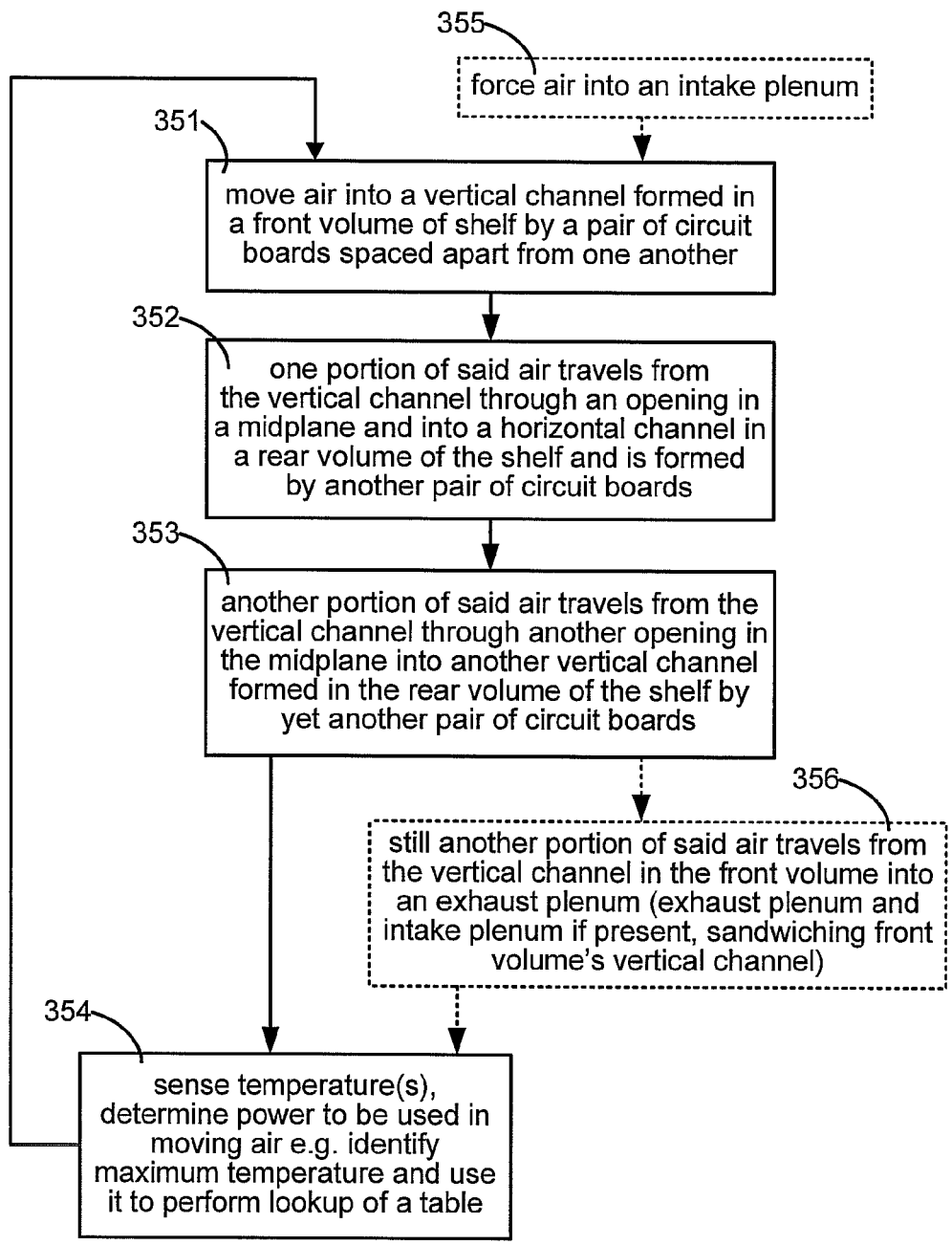
FIG. 3C illustrates, in a flow chart, a method in accordance with the invention, for cooling a chassis of electronics in a communication network.

FIG. 3C illustrates a method that is performed by a chassis of the type described above in some embodiments in accordance with the invention. Specifically, in act 351, the chassis moves air into a vertical channel 201 formed by a circuit boards 211 and a wall 212 (FIG. 2C) that are spaced apart from one another in a front volume 232 of the chassis. Next, in act 352, one portion of said air travels from the vertical channel 201 into a horizontal channel 203 that is oriented laterally relative to the vertical channel 201 and is located in a rear volume of the chassis. Channel 203 is formed by another pair of circuit boards 215 and 216. In act 353, another portion of said air travels from vertical channel 201 in front volume 232 into another vertical channel 202 that is oriented longitudinally relative to vertical channel 201. Channel 202 is formed in a bottom space of rear volume 233 by yet another pair of circuit boards 218 and 217.

In act 354, a control circuit in the chassis senses one or more temperature(s) inside the chassis (e.g. temperature of a board may be sensed), and determines the power to be used in moving air. For example, in act 354, the chassis senses temperature of all boards and identifies a maximum temperature, and uses that maximum temperature to perform a lookup of a table that maps temperature ranges to fan power. The chassis returns to act 351, using the fan power determined in act 354 to now move the air. Thus, a circuit board in such a chassis may include a temperature sensor. The chassis may include a plurality of variable speed fans. The chassis may further include circuitry coupled to each temperature sensor, the circuitry being further coupled to the plurality of variable speed fans.

Note that in some embodiments of chassis have two plenums, namely an intake plenum 229 and an exhaust plenum 302, wherein vertical channels and corresponding boards 271 are sandwiched therebetween. Accordingly, such embodiments of chassis perform an act 355 to force air into intake plenum 299 and this air is then moved in act 351. Additionally, an act 356 may be optionally performed, wherein a portion of air travels from each vertical channel into the exhaust plenum.

Figure 4A:
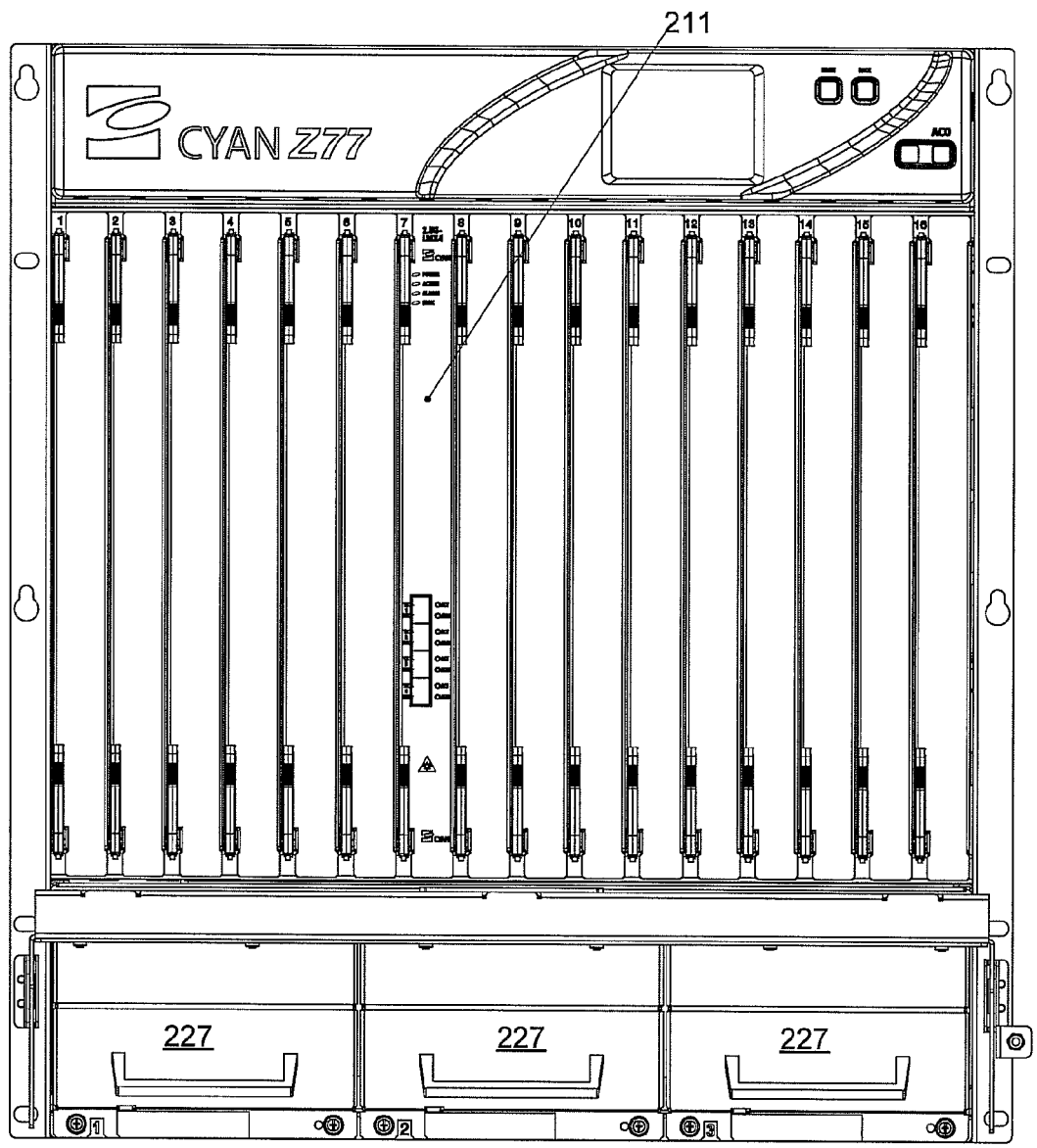
FIG. 4A illustrates the chassis of FIG. 3A in a front elevation view.
Figure 4B:
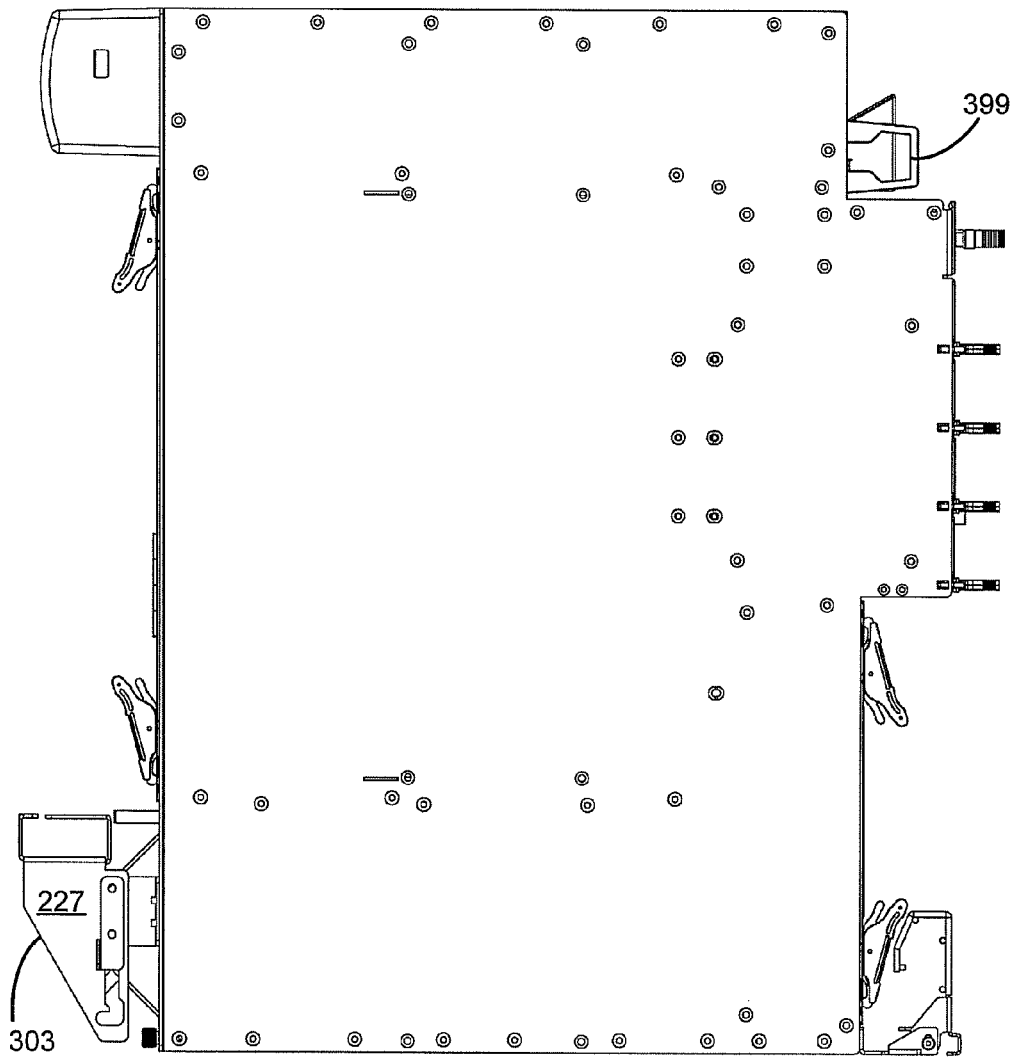
FIGS. 4B and 4C illustrate a side view and a rear view respectively, of the chassis of FIG. 4A.
Figure 4C:
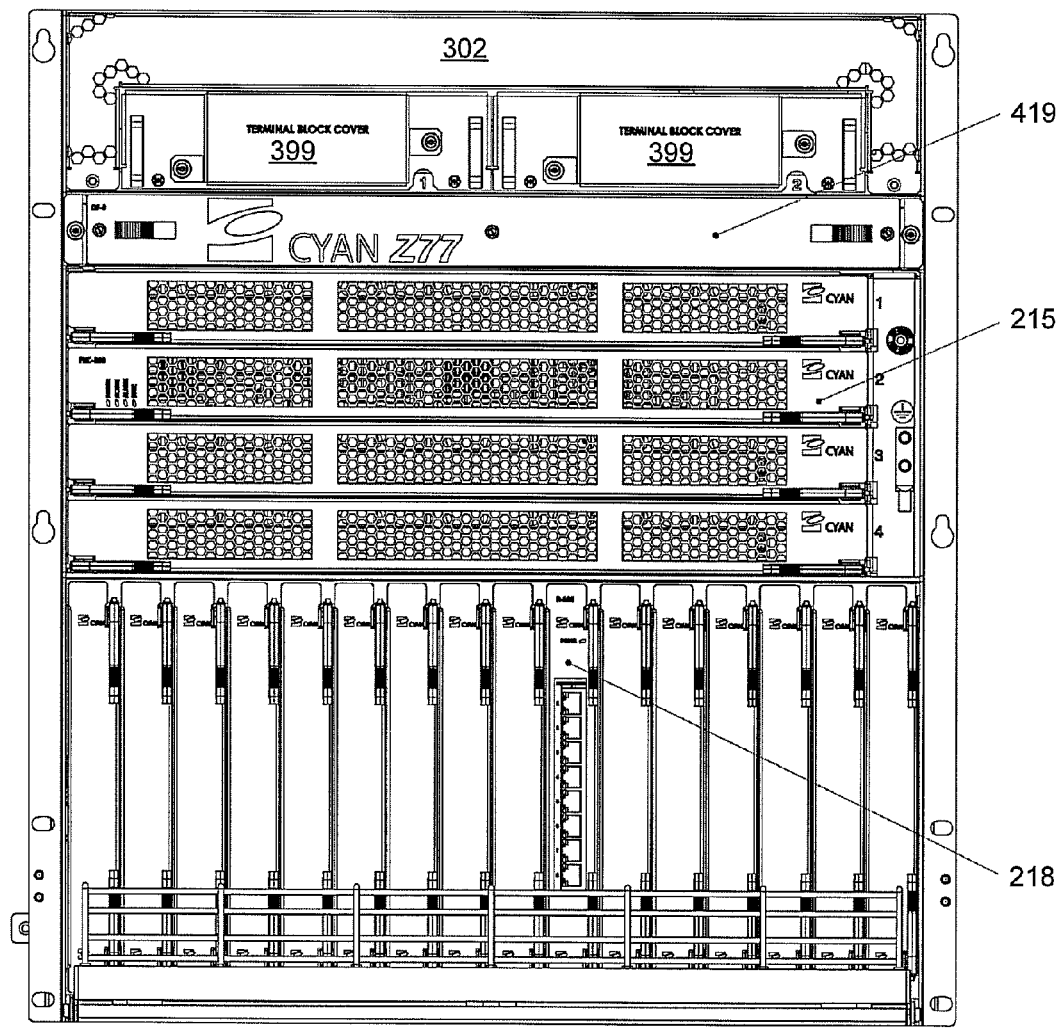
Figure 4D:
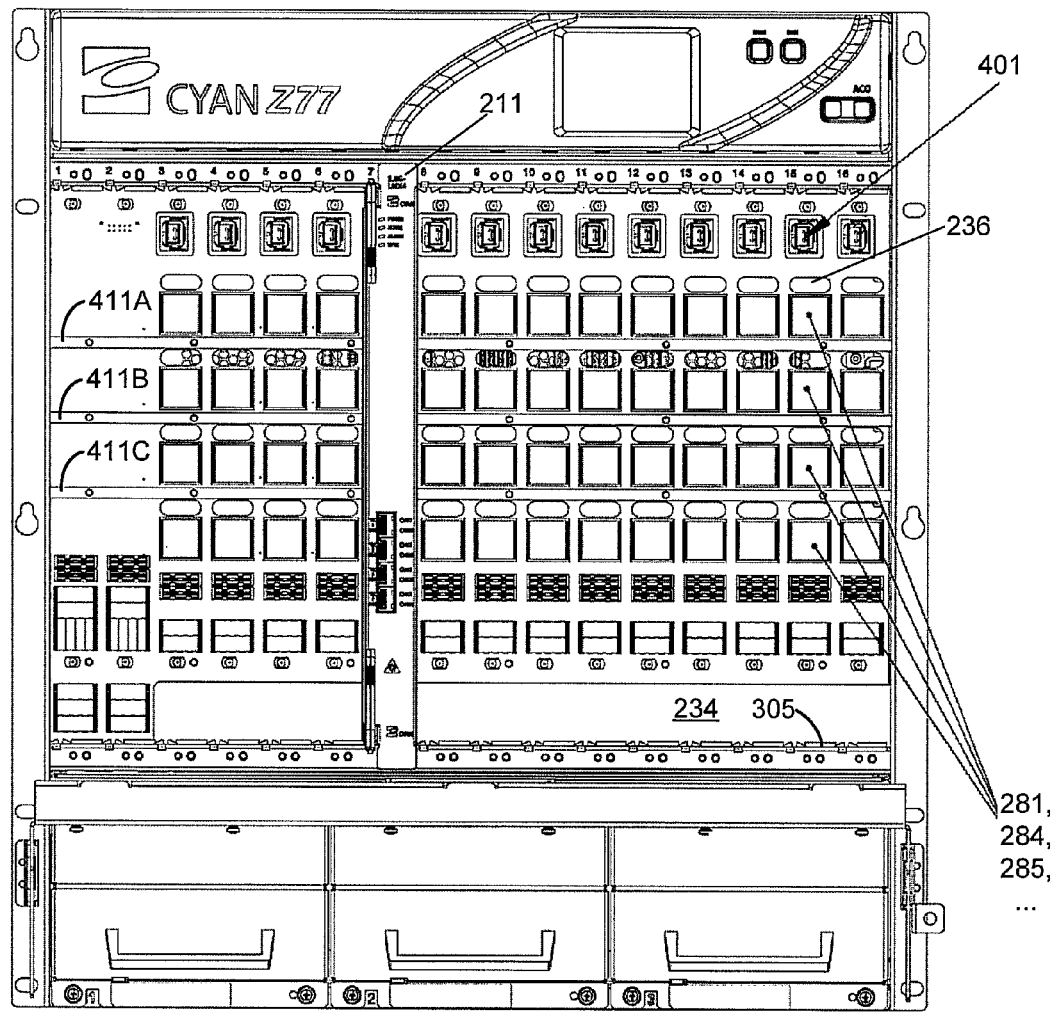
FIGS. 4D and 4E illustrate a front view and a perspective of a front region of the shelf of FIGS. 4A-4C, the front region being used to form inlet channels.
Figure 4E:
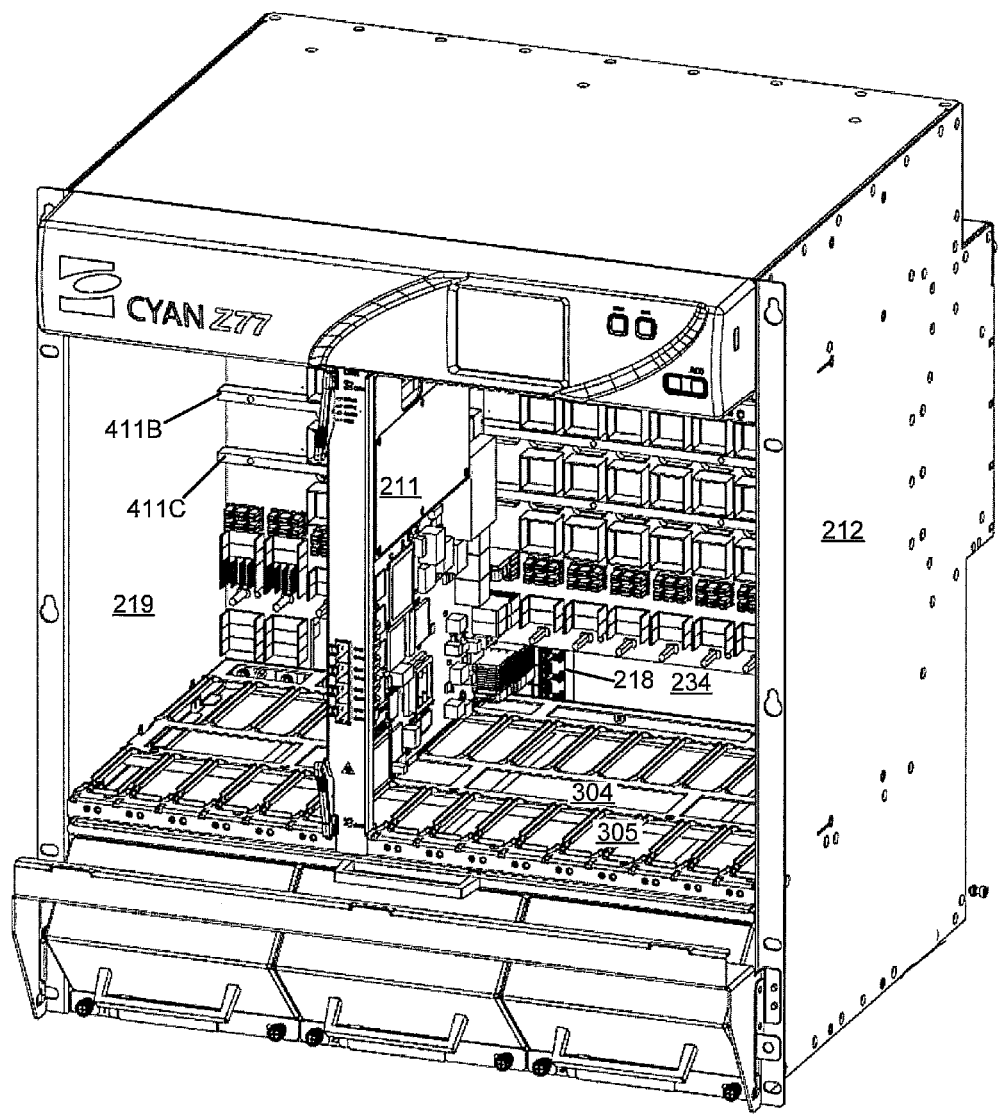
Figure 4F:
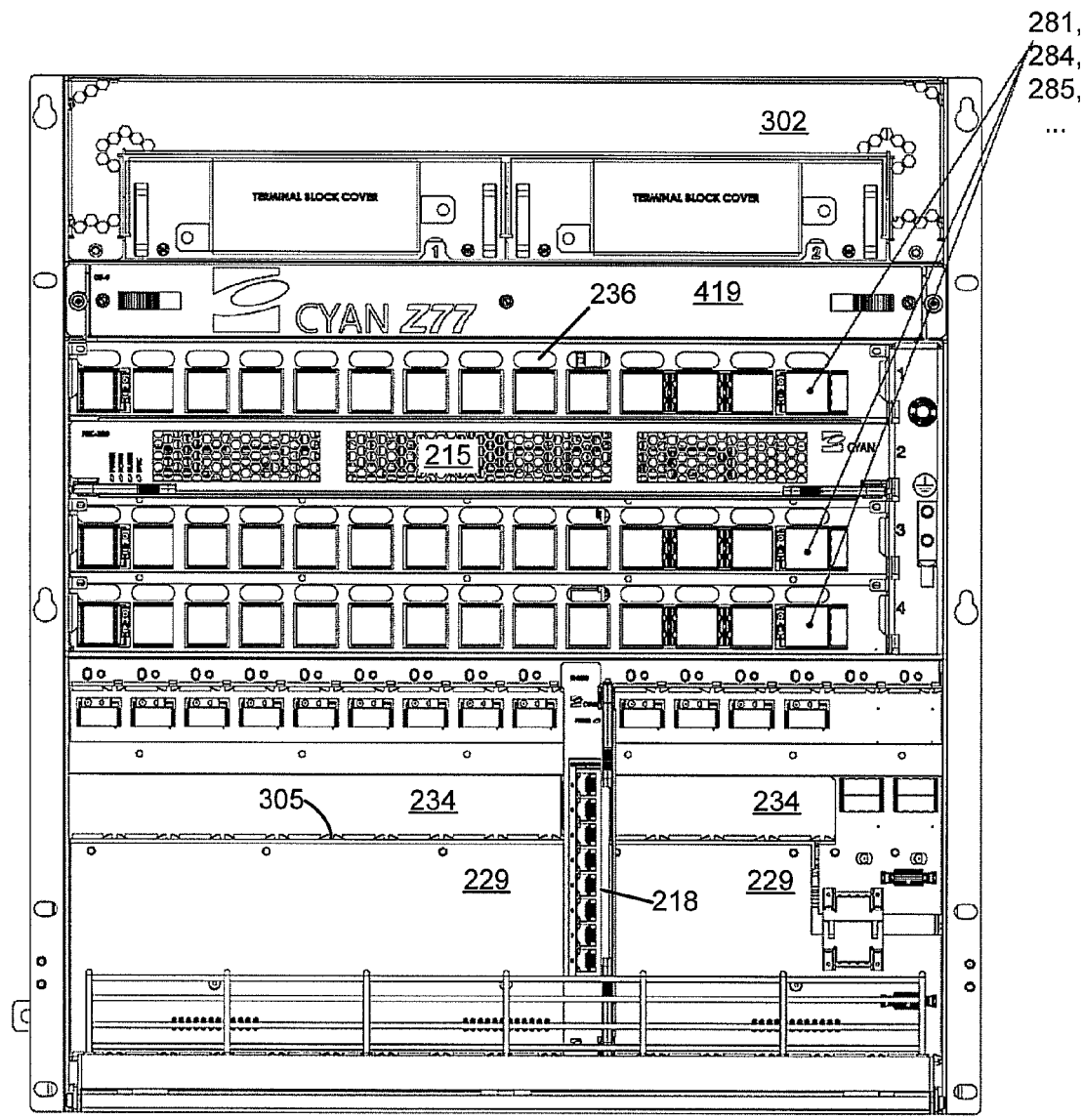
FIGS. 4F and 4G illustrate a rear view and a perspective of a rear region of the shelf of FIGS. 4A-4E, the rear region being used to form horizontal channels.
Figure 4G:
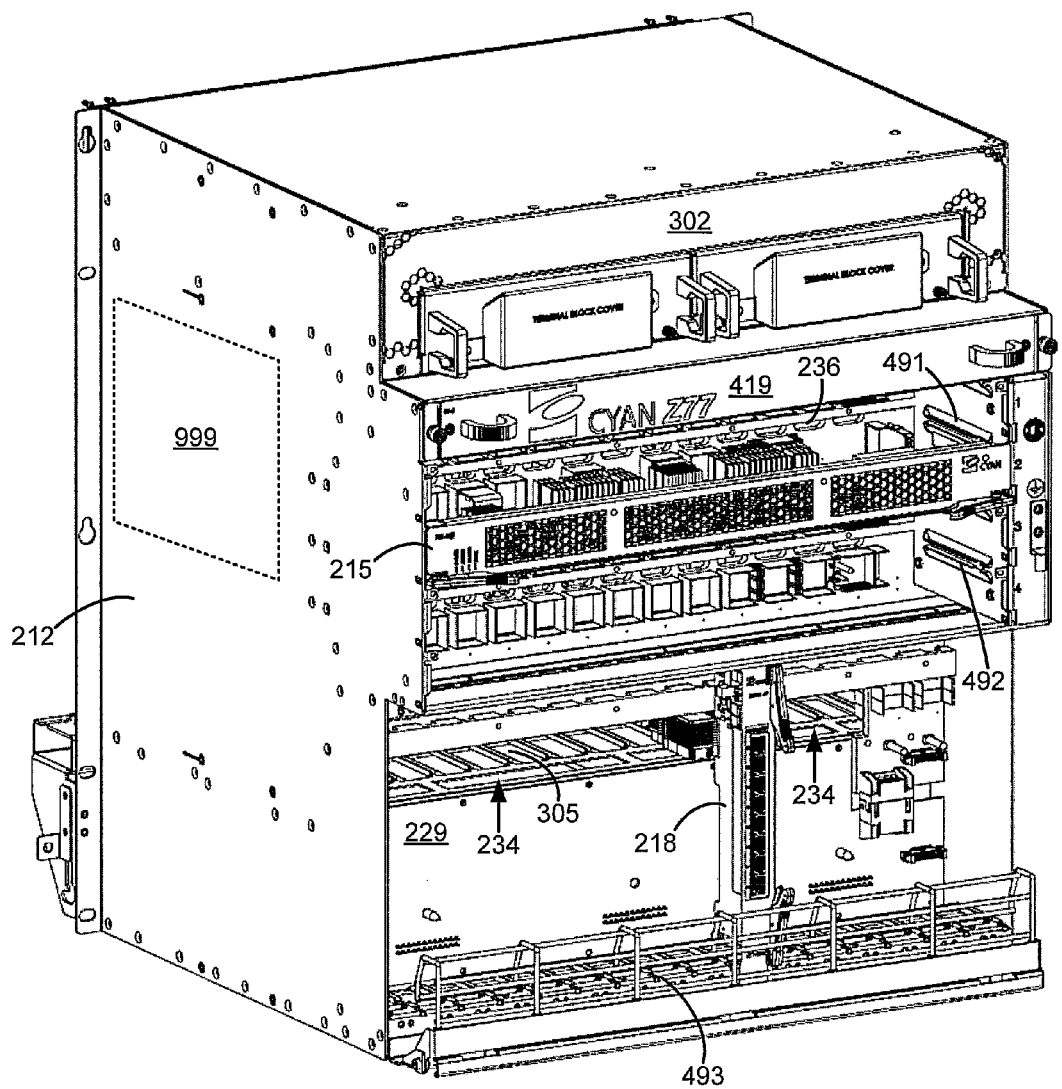
Figure 4H:
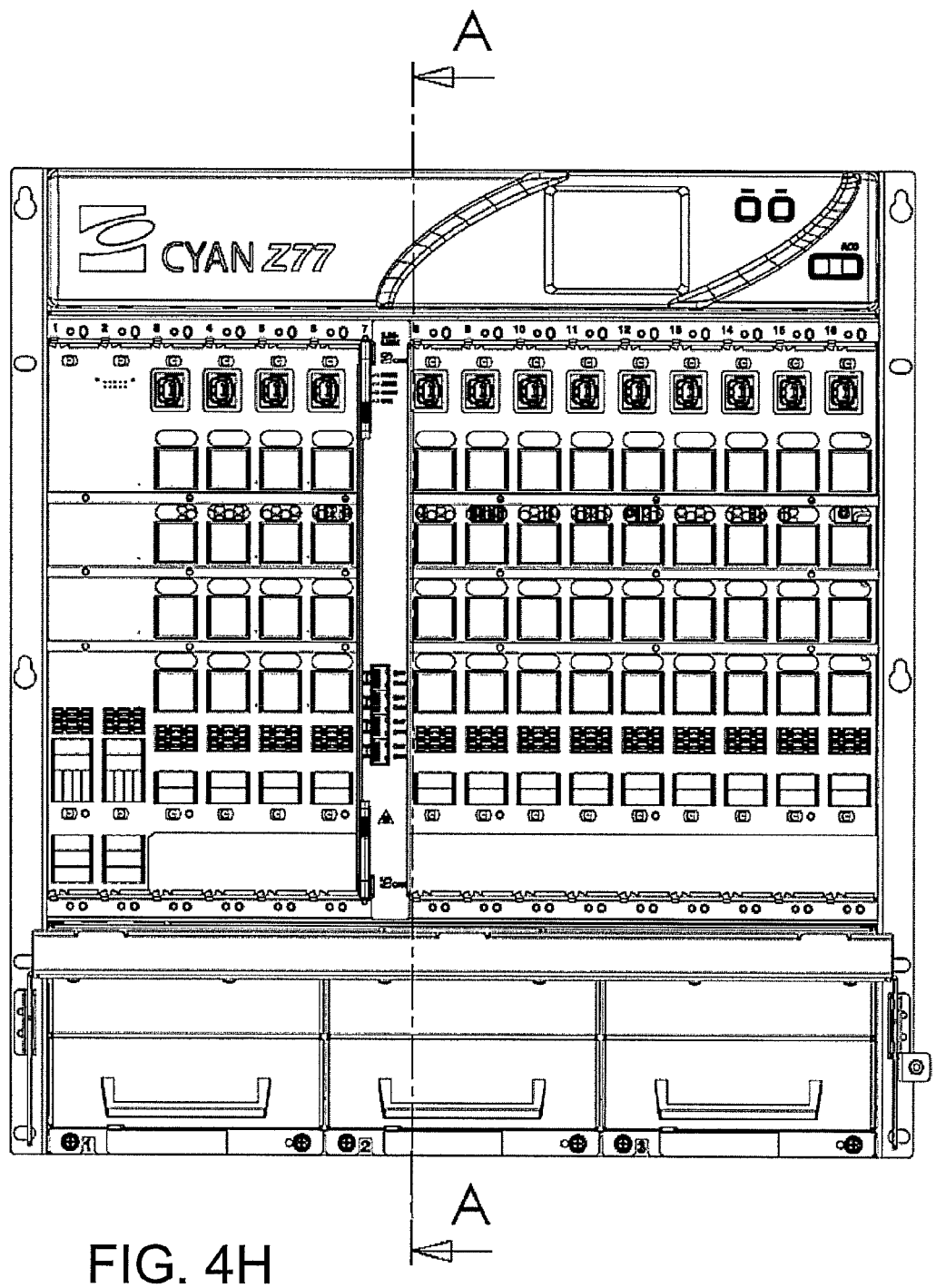
FIG. 4H is same as FIG. 4D with the addition of a section line A-A along which is shown a cross-sectional view in FIG. 4I.
Figure 4I:
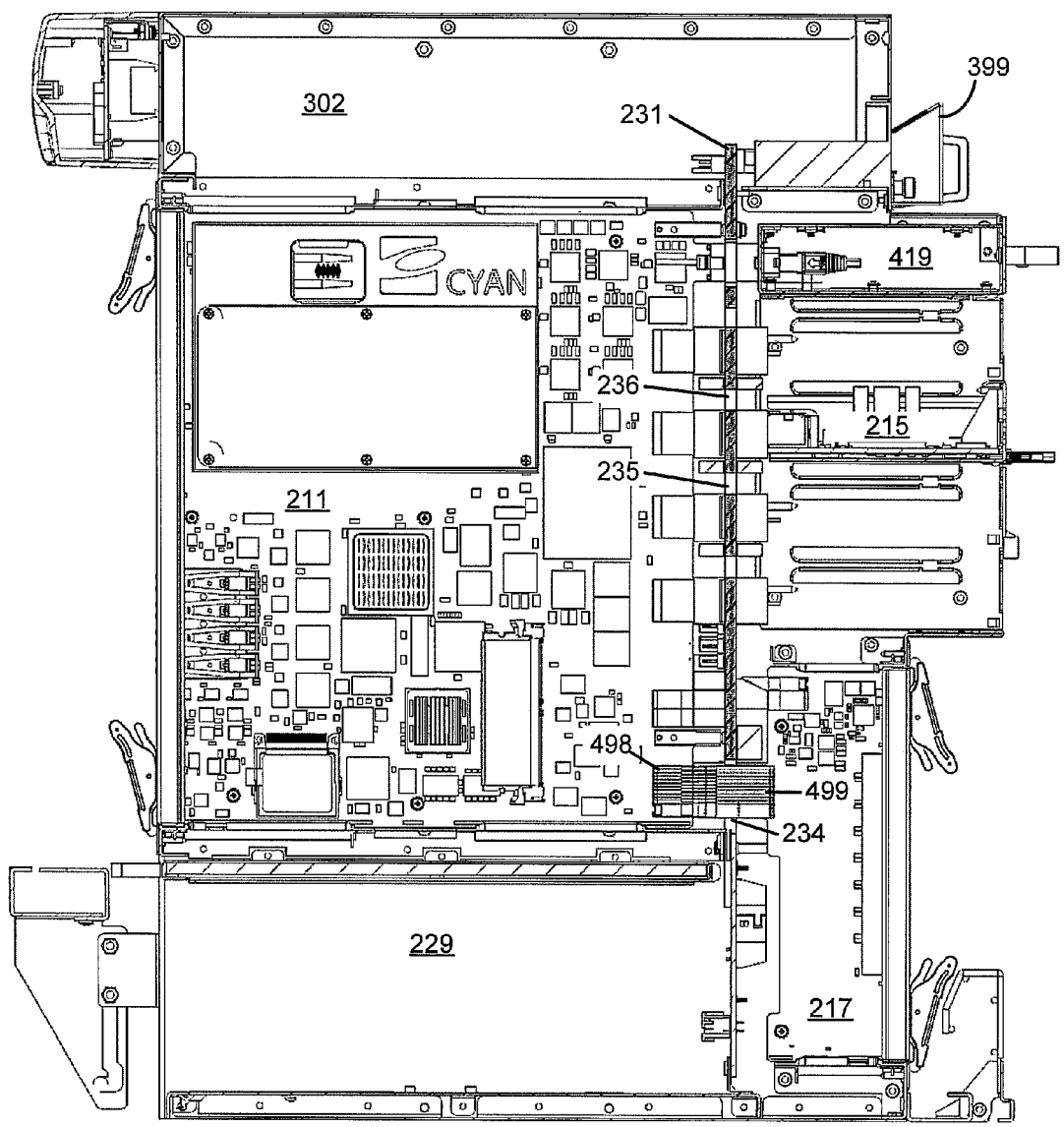
FIG. 4I is a cross-sectional view along section line A-A of FIG. 4H.
Figure 4J:
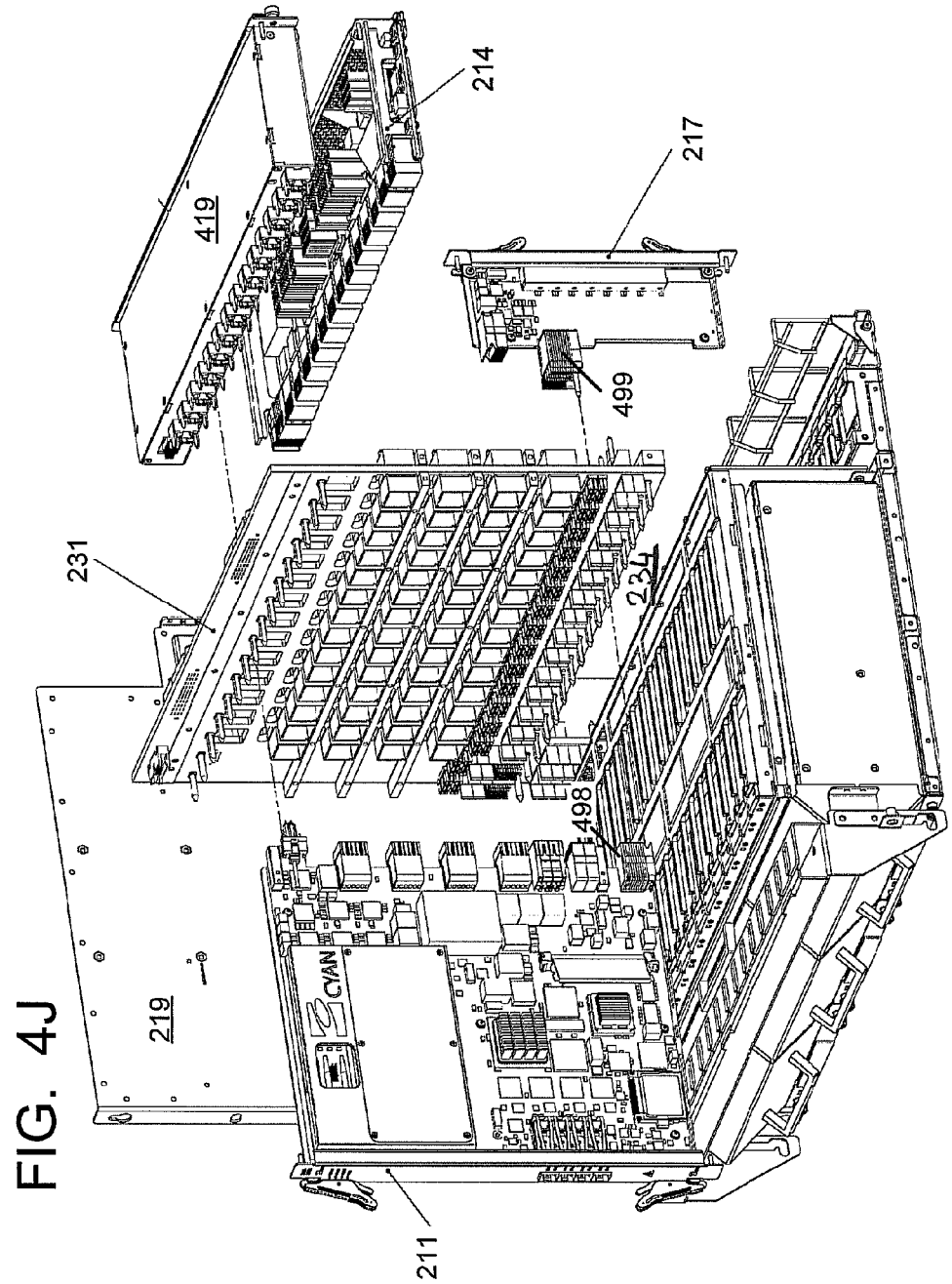
FIG. 4J is an exploded view of the shelf of FIGS. 4A-4I, wherein top and side portions of the shelf are removed to improve clarity.

FIG. 4A illustrates the chassis of FIG. 3A in a front elevation view. FIGS. 4B and 4C illustrate a side view and a rear view respectively, of the chassis of FIG. 4A. FIGS. 4D and 4E illustrate a front view and a perspective of a front region of the shelf of FIGS. 4A-4C, the front region being used to form inlet channels. FIGS. 4F and 4G illustrate a rear view and a perspective of a rear region of the shelf of FIGS. 4A-4E, the rear region being used to form horizontal channels. FIG. 4H is same as FIG. 4D with the addition of a section line A-A along which is shown a cross-sectional view in FIG. 4I. FIG. 4I is a cross-sectional view along section line A-A of FIG. 4H. FIG. 4J is an exploded view of the shelf of FIGS. 4A-4I, wherein top and side portions of the shelf are removed to improve clarity.

Referring to FIGS. 4A-4J, note that a connector 499 of a rear termination module 217 mates directly with a corresponding connector 498 of a front line card 211 through opening 234 in the midplane 231. Specifically, in several embodiments, no connectors on midplane 231 are used to electrically connect vertical circuit boards 273 in rear volume 233 to vertical circuit boards 271 in front volume 232. In the just described embodiments, opening 234 between volumes 232 and 233 is sufficiently large to accommodate connectors for electrical interconnection between two longitudinally aligned circuit boards and also enable airflow to pass between these volumes.

Numerous modifications and adaptations of the embodiments described herein will become apparent to the skilled artisan in view of this disclosure. For example, although in several embodiments, there are no openings in the right side wall 212 and left side wall 219 of a chassis for air to exit laterally from the chassis, certain alternative embodiments do have openings in their two sidewalls. The precise location and dimensions of sidewall openings, if present in a chassis, are predetermined based on cooling requirements of electronic components in the chassis, e.g. in one embodiment, the two sidewalls 212 and 219 have openings in an upper region in front volume 232, as illustrated by region 999 of sidewall 212 shown in FIG. 4G. As front volume 232 is maintained at a higher pressure than ambient in several embodiments, airflow through sidewall openings is regulated in some embodiments by baffles (not shown), as will be readily apparent to the skilled artisan in view of this disclosure. Numerous modifications and adaptations of the embodiments described herein are encompassed by the scope of the invention.

What is claimed is:

1. A method of cooling a shelf of electronics in a communication network, the method comprising:
    moving air from outside the shelf into a first channel formed by a pair of first circuit boards spaced apart from one another in the shelf;
    wherein:
    a portion of said air travels from the first channel, through an opening in a wall, into a second channel that is oriented laterally relative to said first channel;
    said second channel is formed by a pair of second circuit boards spaced apart from one another in the shelf, said second circuit boards being oriented laterally relative to said first circuit boards;
    said wall is located between said first circuit boards and said second circuit boards;
    another portion of said air travels from said first channel, through another opening in the wall, into a third channel; and
    said third channel is formed by a pair of third circuit boards spaced apart from one another in the shelf.

2. The method of claim 1 wherein:
    prior to entering said first channel, said air is forced into a first plenum in said shelf;
    another portion of said air travels from said first channel into a second plenum in said shelf; and
    said pair of first circuit boards are located between said first plenum and said second plenum.

3. The method of claim 1 wherein:
    said first channel is oriented vertically;
    said second channel is oriented horizontally; and
    the third channel is oriented vertically.

4. The method of claim 1 further comprising:
    sensing a temperature in said shelf; and
    using at least said temperature to determine power used in said moving.

5. The method of claim 1 further comprising:
    sensing a plurality of temperatures of a corresponding plurality of circuit boards;

identifying a maximum temperature from among said plurality of temperatures; and performing a lookup of a table using said maximum temperature to identify a speed of at least one fan used in said moving;

wherein said table maps a set of predetermined temperature ranges to a corresponding set of speeds.

6. A shelf for use in a rack in a communication network, the shelf comprising:

a wall between a first volume and a second volume in said shelf;

a pair of first guides located within said first volume;

wherein said pair of first guides define a plurality of first slots in said shelf;

a pair of first circuit boards located in a pair of first slots in said plurality of first slots, said pair of first circuit boards being separated from one another to define a first channel therebetween;

a pair of second guides located within said second volume, said pair of second guides being oriented laterally relative to said pair of first guides;

wherein said pair of second guides define a plurality of second slots in said shelf;

a pair of second circuit boards located in a pair of second slots in said plurality of second slots, said pair of second circuit boards being separated from one another to define a second channel therebetween, said second channel being oriented laterally relative to said first channel;

wherein said wall defines at least one opening between said first channel and said second channel;

a pair of third circuit boards spaced apart from one another in the shelf to define a third channel therebetween;

wherein said wall defines at least another opening between said first channel and said third channel.

7. The shelf of claim 6 further comprising:

at least one fan separated by a plenum from a first guide in said pair of first guides; and said first guide defining another opening between said plenum and said first channel.

8. The shelf of claim 6 further comprising:

a fan;

a first plenum located between said fan and one guide in said pair of first guides;

wherein said one guide defines a first additional opening between said first plenum and said first channel; and a second plenum;

wherein another guide in said pair of first guides defines a second additional opening between said second plenum and said first channel.

9. The shelf of claim 8 wherein:

said fan has an axis of rotation parallel to a first circuit board in said pair of first circuit boards.

10. The shelf of claim 6 wherein:

each of said first circuit boards comprises a temperature sensor; and the shelf further comprises a plurality of variable speed fans; and the shelf further comprises circuitry coupled to each temperature sensor, said circuitry being further coupled to said plurality of variable speed fans.

11. A method of manufacturing a shelf of electronics for use in a communication network, the method comprising:

inserting a pair of first circuit boards from a first side of the shelf up to a wall in the shelf, to form a first channel between said first circuit boards, said first channel having at least a pair of outlets formed by openings in said wall;

inserting a pair of second circuit boards from a second side of the shelf up to said wall in the shelf, to form a second channel between said second circuit boards, said second channel being oriented laterally relative to said first channel, said second channel having a first inlet connected to a first outlet in said pair of outlets; and inserting a pair of third circuit boards from said second side of the shelf up to said wall in the shelf, to form a third channel between said third circuit boards, said third channel being oriented longitudinally relative to said first channel, said third channel having a second inlet connected to a second outlet in said pair of outlets.

12. The method of claim 11 wherein:

said inserting of the pair of first circuit boards comprises sliding a first circuit board into a vertical slot in one region of the shelf;

said inserting of the pair of second circuit boards comprises sliding a second circuit board into a horizontal slot in another region of the shelf.

13. The method of claim 11 wherein:

on completion of said inserting of the pair of first circuit boards, at least a first connector on a first circuit board engages with a connector in said wall.

14. The method of claim 11 wherein:

when said inserting of the pair of first circuit boards and said inserting of the pair of second circuit boards are completed, the wall provides electrical connectivity at least between a first circuit board in the pair of first circuit boards and a second circuit board in the pair of second circuit boards.

15. The method of claim 11 wherein:

said wall comprises a connector that passively couples a first connector on a first circuit board in the pair of first circuit boards to a second connector on a second circuit board in the pair of second circuit boards.

16. The method of claim 11 wherein:

on completion of said insertings, a first connector on one of said first circuit boards mates directly with a third connector on one of said third circuit boards, through another opening in the wall.

17. The method of claim 11 wherein:

said first channel is oriented vertically;

said second channel is oriented horizontally; and said third channel is oriented vertically.

18. The method of claim 1 wherein:

power is used in said moving.

19. The method of claim 18 further comprising:

sensing a plurality of temperatures in said shelf; and identifying said power using at least one of said temperatures.

20. The method of claim 19 wherein:

said power is identified by looking up a table.

21. The method of claim 1 wherein:

at least one fan is used in said moving.

22. The method of claim 1 wherein:

prior to entering said first channel, said air is forced into a plenum in said shelf.

23. The method of claim 1 wherein:

air in said plenum is at high pressure relative to ambient.

24. The method of claim 1 wherein:

a portion of said air travels from said first channel into a plenum in said shelf.

25. The method of claim 1 wherein:
an external forced air cooling system is used in said moving.

26. The method of claim 1 wherein:
air is pulled through said openings in said wall.

27. The shelf of claim 6 further comprising:
a fan;
a plenum located between said fan and at least one guide in said pair of first guides;
wherein said at least one guide defines an additional opening between said plenum and said first channel.

* * * * *